United States Patent
Kuma et al.

(10) Patent No.: US 12,307,723 B2
(45) Date of Patent: May 20, 2025

(54) INFORMATION PROCESSING APPARATUS AND METHOD

(71) Applicant: SONY GROUP CORPORATION, Tokyo (JP)

(72) Inventors: Satoru Kuma, Tokyo (JP); Ohji Nakagami, Tokyo (JP)

(73) Assignee: SONY GROUP CORPORATION, Tokyo (JP)

( * ) Notice: Subject to any disclaimer, the term of this patent is extended or adjusted under 35 U.S.C. 154(b) by 122 days.

(21) Appl. No.: 18/042,035

(22) PCT Filed: Aug. 12, 2021

(86) PCT No.: PCT/JP2021/029697
§ 371 (c)(1),
(2) Date: Feb. 17, 2023

(87) PCT Pub. No.: WO2022/044818
PCT Pub. Date: Mar. 3, 2022

(65) Prior Publication Data
US 2023/0334704 A1   Oct. 19, 2023

(30) Foreign Application Priority Data
Aug. 25, 2020  (JP) ................. 2020-141732

(51) Int. Cl.
*G06T 9/00*  (2006.01)
*H04N 19/59*  (2014.01)

(52) U.S. Cl.
CPC ............. *G06T 9/00* (2013.01); *H04N 19/59* (2014.11); *G06T 2210/56* (2013.01)

(58) Field of Classification Search
CPC ........ G06T 9/00; G06T 2210/56; H04N 19/59
(Continued)

(56) References Cited

U.S. PATENT DOCUMENTS

2019/0080483 A1\* 3/2019 Mammou ............. G06T 3/4007
2020/0111236 A1\* 4/2020 Tourapis ................. G06T 9/001
(Continued)

OTHER PUBLICATIONS

International Search Report and Written Opinion of PCT Application No. PCT/JP2021/029697, issued on Oct. 12, 2021, 06 pages of ISRWO.

(Continued)

*Primary Examiner* — Albert Kir
(74) *Attorney, Agent, or Firm* — CHIP LAW GROUP

(57) ABSTRACT

The present disclosure relates to an information processing apparatus and method capable of reducing a decrease in flexibility in controlling an amount of coding point cloud data. There are formed a reference structure of geometry data in coding of a point cloud that represents a three-dimensional object as a set of points, corrected the geometry data so that a coding amount decreases, derived, on the basis of the formed reference structure, a predicted value of the corrected geometry data, derived a predictive residual that is a difference between the geometry data and the predicted value, and coded the derived predictive residual. The present disclosure can be applied to, for example, an information processing apparatus, an image processing apparatus, a coding apparatus, an electronic device, an information processing method, a program, or the like.

15 Claims, 27 Drawing Sheets

(58) Field of Classification Search
USPC .................................................. 375/240.08
See application file for complete search history.

(56) References Cited

U.S. PATENT DOCUMENTS

2021/0019937 A1* 1/2021 Gallaway ................ G06T 17/05
2023/0360273 A1* 11/2023 Oh ......................... H04N 19/96

OTHER PUBLICATIONS

Gao, et al., "[G-PCC][New proposal] Predictive Geometry Coding", Apple Inc., International Organisation for Standardisation, Coding of Moving Pictures And Audio, ISO/IEC JTC1/SC29/WG11, MPEG2019/m51012, Nov. 2019, 9 pages.

Gao, et al., "[G-PCC][New proposal] Using L1 norm for nearest neighbour search in Prediction and Lifting schemes", Apple Inc., International Organisation for Standardisation, Coding of Moving Pictures And Audio, ISO/IEC JTC1/SC29/WG11, MPEG2019/m51011, Nov. 2019, 5 pages.

Gao, et al., "[G-PCC][New proposal] Improved implementation of the Prediction and Lifting schemes", Apple Inc., International Organisation for Standardisation, Coding of Moving Pictures And Audio, ISO/IEC JTC1/SC29/WG11, MPEG2019/m51010, Nov. 2019, 9 pages.

Flynn, et al., "G-PCC: Combined octree-predictive geometry coding", Apple Inc., International Organisation for Standardisation, Coding of Moving Pictures And Audio, ISO/IEC JTC1/SC29/WG11, MPEG/m52519, Jan. 2020, 3 pages.

Mekuria, et al., "Design, Implementation and Evaluation of a Point Cloud Codec for Tele-Immersive Video", Institute of Electrical and Electronics Engineers (IEEE), Jan. 2016, 14 pages.

* cited by examiner

CAPTURE ORDER: 0, 1, 2, 3, 4, 5

DECODING ORDER: 0, 1, 2, 3, 4, 5

DECODING ORDER: 0, 1, 3, 4, 5, 2

FIG. 5

| 1 | CORRECT GEOMETRY DATA SO THAT CODING AMOUNT DECREASES IN CODING USING PREDICTIVE RESIDUAL |
|---|---|
| 1-1 | PERFORM CORRECTION ACCORDING TO REFERENCE STRUCTURE |
| 1-2 | PERFORM CORRECTION WITHIN ALLOWABLE ERROR |
| 1-3 | PERFORM RESAMPLING |
| 1-3-1 | PERFORM RESAMPLING ACCORDING TO REFERENCE STRUCTURE |
| 1-3-2 | PERFORM RESAMPLING WITHIN ALLOWABLE ERROR |
| 1-3-3 | REDEFINE ATTRIBUTE DATA |
| 1-4 | PERFORM REFINEMENT |
| 1-4-1 | PERFORM REFINEMENT ACCORDING TO REFERENCE STRUCTURE |
| 1-4-2 | PERFORM REFINEMENT WITHIN ALLOWABLE ERROR |
| 1-4-3 | PERFORM RE-COLORING |
| 1-5 | COMBINE QUANTIZATION, RESAMPLING, AND REFINEMENT |

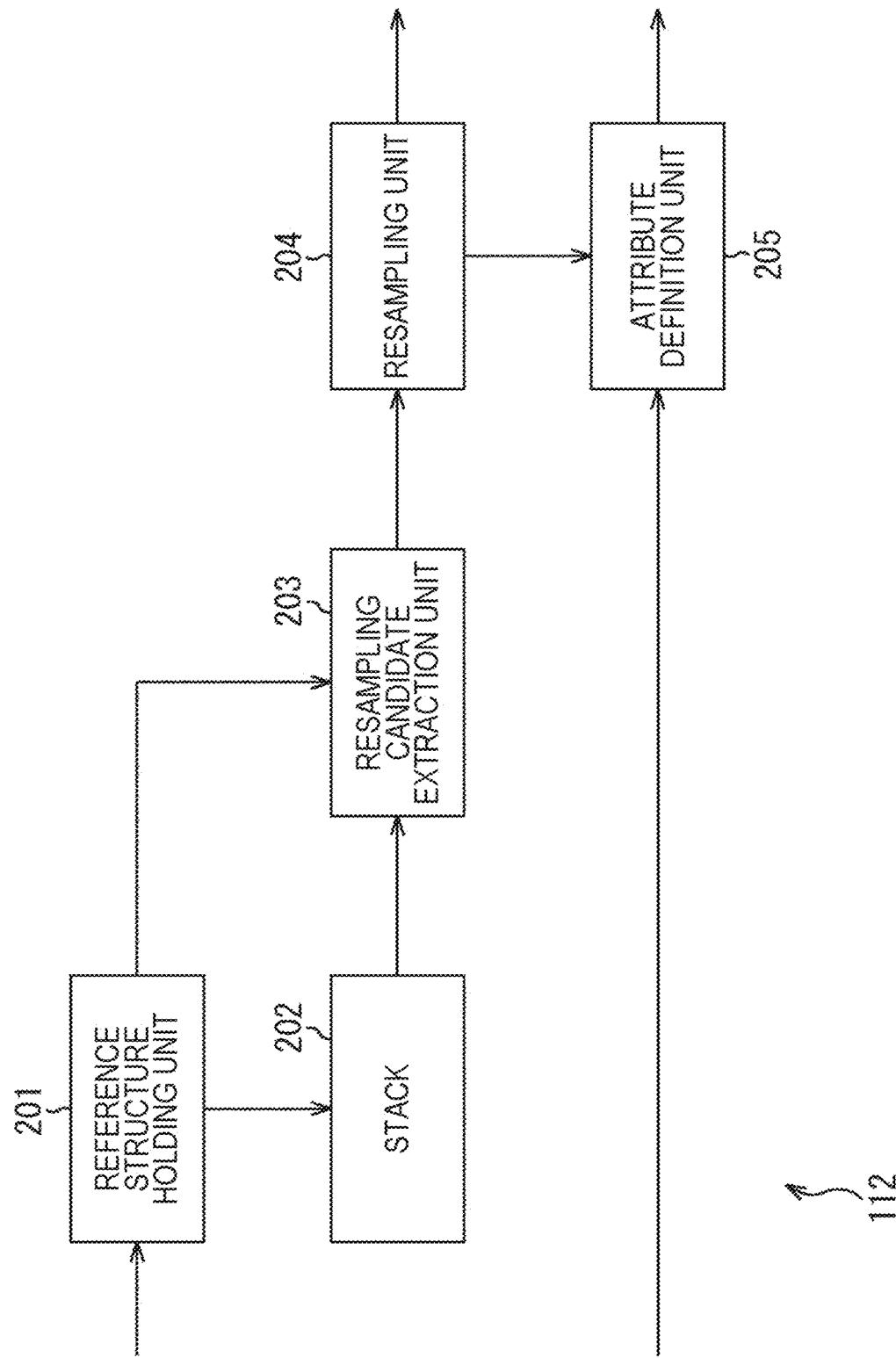

FIG. 15

|   | CURRENT | CHILD OF CURRENT | PARENT OF CURRENT | PARENT OF PARENT OF CURRENT |
|---|---------|------------------|-------------------|------------------------------|
| 1 | TARGET  | TARGET           |                   |                              |
| 2 |         | TARGET           |                   |                              |
| 3 | TARGET  | TARGET           | TARGET            |                              |
| 4 | TARGET  | TARGET           | TARGET            | TARGET                       | the coding amount due to the quantization step
changing by one.

CITATION LIST

Non-Patent Documents

Non-Patent Document 1: R. Mekuria, Student Member IEEE, K. Blom, P. Cesar., Member, IEEE, "Design, Implementation and Evaluation of a Point Cloud Codec for Tele-Immersive Video", tcsvt_paper_submitted_february.pdf Non-Patent Document 2: Zhenzhen Gao, David Flynn, Alexis Tourapis, and Khaled Mammou, "[G-PCC][New proposal] Predictive Geometry Coding", ISO/IEC JTC1/SC29/WG11 MPEG2019/m51012, October 2019, Geneva, CH

SUMMARY OF THE INVENTION

Problems to be Solved by the Invention

Therefore, it is difficult to perform finer control than that. That is, in such quantization, there is a possibility that the degree of flexibility in controlling the coding amount decreases.

INFORMATION PROCESSING APPARATUS AND METHOD

CROSS REFERENCE TO RELATED APPLICATIONS

This application is a U.S. National Phase of International Patent Application No. PCT/JP2021/029697 filed on Aug. 12, 2021, which claims priority benefit of Japanese Patent Application No. JP 2020-141732 filed in the Japan Patent Office on Aug. 25, 2020. Each of the above-referenced applications is hereby incorporated herein by reference in its entirety.

TECHNICAL FIELD

The present disclosure relates to an information processing apparatus and method, and more particularly, to an information processing apparatus and method capable of reducing a decrease in flexibility in controlling an amount of coding point cloud data.

BACKGROUND ART

Conventionally, there has been considered a method for coding 3D data representing a three-dimensional structure such as a point cloud, for example (refer to Non-Patent Document 1, for example). Furthermore, there has been considered a method with which, when geometry data of the point cloud is coded, a difference value from a predicted value (predictive residual) is derived and the predictive residual is coded (refer to Non-Patent Document 2, for example).

It is useful to control the coding amount generated in such coding. For example, there is a method for reducing the generated coding amount by quantizing the point cloud data before the coding. In a case of such quantization, information amount (that is, the generated coding amount) of the point cloud data can be controlled by changing a quantization step. That is, a degree of flexibility (fineness of control) of coding amount control in such quantization is an amount of change in the coding amount due to the quantization step changing by one.

The present disclosure has been made in view of such circumstances, and an object thereof is to reduce a decrease in flexibility in controlling an amount of coding point cloud data.

Solutions to Problems

An information processing apparatus according to one aspect of the present technology includes a reference structure formation unit that forms a reference structure of geometry data in coding of a point cloud that represents a three-dimensional object as a set of points, a correction unit that corrects the geometry data so that a coding amount decreases, a predictive residual derivation unit that derives, on the basis of the reference structure formed by the reference structure formation unit, a predicted value of the geometry data corrected by the correction unit, and derives a predictive residual that is a difference between the geometry data and the predicted value, and a coding unit that codes the predictive residual derived by the predictive residual derivation unit.

An information processing method according to one aspect of the present technology includes forming a reference structure of geometry data in coding of a point cloud that represents a three-dimensional object as a set of points, correcting the geometry data so that a coding amount decreases, deriving, on the basis of formed the reference structure, a predicted value of corrected the geometry data, deriving a predictive residual that is a difference between the geometry data and the predicted value, and coding derived the predictive residual.

In an information processing apparatus and method according to one aspect of the present technology, there are formed a reference structure of geometry data in coding of a point cloud that represents a three-dimensional object as a set of points, corrected the geometry data so that a coding amount decreases, derived, on the basis of the formed reference structure, a predicted value of the corrected geometry data, derived a predictive residual that is a difference between the geometry data and the predicted value, and coded the derived predictive residual.

BRIEF DESCRIPTION OF DRAWINGS

FIG. 5 is a diagram describing an example of a method for the coding amount control.

FIG. 12 is a block diagram illustrating a main configuration example of a correction unit.

FIG. 15 is a diagram describing an example of a resampling candidate.

MODE FOR CARRYING OUT THE INVENTION

Modes for carrying out the present disclosure (hereinafter, referred to as embodiments) will be described below. Note that the description will be made in the following order.
1. Coding amount control in predictive residual coding
2. First embodiment (correction of geometry data)
3. Second embodiment (resampling)
4. Third embodiment (refinement)
5. Fourth Embodiment (combination)
6. Supplementary note 1. Coding Amount Control in Predictive Residual Coding <Documents or the Like Supporting Technical Content/Technical Terms>

The scope disclosed in the present technology includes not only the content described in the embodiments but also the content described in the following non-patent documents that are known at the time of filing.
Non-Patent Document 1: (described above)
Non-Patent Document 2: (described above)

That is, contents described in the above-described non-patent documents, contents of other documents referred to in the above-described non-patent documents, and the like serve as bases for determining support requirements.
<Point Cloud>

Conventionally, there has been 3D data such as a point cloud representing a three-dimensional structure with point position information, attribute information, and the like, or as Mesh that includes vertices, edges, faces, and defines a three-dimensional structure by using polygonal representation.

For example, in a case of the point cloud, a three-dimensional structure (three-dimensional object) is represented as a set of a large number of points. The data of the point cloud (also referred to as point cloud data) includes position information of each point (also referred to as geometry data) and attribute information (also referred to as attribute data) of each point. The attribute data can include any information. For example, color information, reflectance information, normal line information, or the like of each point may be included in the attribute data. Thus, the point cloud data has a relatively simple data structure, and can represent an arbitrary three-dimensional structure with sufficient accuracy by using a sufficiently large number of points.

<Predictive Geometry Coding>

Because such point cloud data has a relatively large amount of data, generally, the amount of data is reduced by coding or the like at a time of recording or transmitting the data, or the like. As the coding method, various methods have been proposed. For example, Non-Patent Document 2 describes predictive geometry coding as a method for coding geometry data.

Predictive geometry coding is one of predictive residual coding methods for deriving a difference between geometry data of each point and a predicted value thereof (also referred to as a predictive residual), and coding the predictive residual. In predictive geometry coding, geometry data of another point is referred to when deriving the predicted value.

Figure 1:
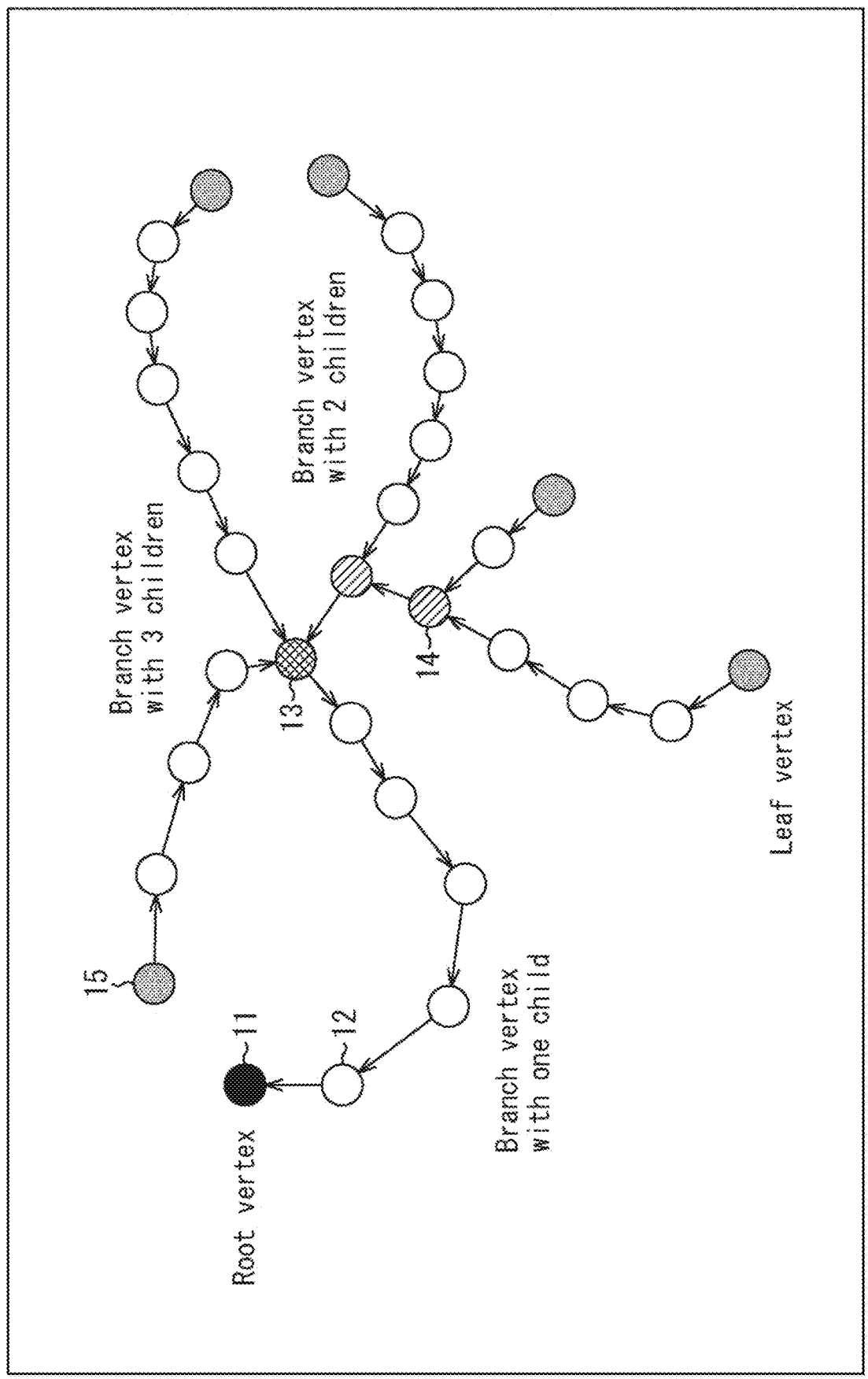
FIG. 1 is a diagram describing predictive geometry coding.

For example, as illustrated in FIG. 1, there is formed a reference structure (also referred to as a prediction tree) indicating which point's geometry data is referred to when deriving a predicted value of geometry data of each point. In FIG. 1, a circle indicates a point, and an arrow indicates a reference relation. A method for forming the reference structure is arbitrary. For example, the reference structure is formed such that geometry data of a neighboring point is referred to.

In the prediction tree in an example in FIG. 1, there are formed a point 11 (Root vertex) that does not refer to geometry data of another point, a point 12 (Branch vertex with one child) that is referred to by another one point, a point 13 (Branch vertex with 3 children) that is referred to by other three points, a point 14 (Branch vertex with 2 children) that is referred to by other two points, and a point 15 (Leaf vertex) that is not referred to by another point.

Note that, although only one point 12 is denoted by a reference sign in FIG. 1, all points indicated with a white circle are points 12. Similarly, although only one point 14 is denoted by a reference sign, all points indicated with a striped circle in FIG. 1 are points 14. Similarly, although only one point 15 is denoted by a reference sign, all points indicated with a gray circle in FIG. 1 are points 15. Note that a structure of the prediction tree is an example, and is not limited to the example in FIG. 1. Therefore, the number of each of the points 11 to 15 is arbitrary. Furthermore, a pattern of the number of points to be referred to is not limited to the patterns in the example in FIG. 1. For example, there may be a point referred to by four or more points.

A predicted value of geometry data of each point is derived according to such a reference structure (prediction tree). For example, predicted values are derived by four methods (four modes), and an optimum predicted value is selected from among the predicted values.

Figure 2:
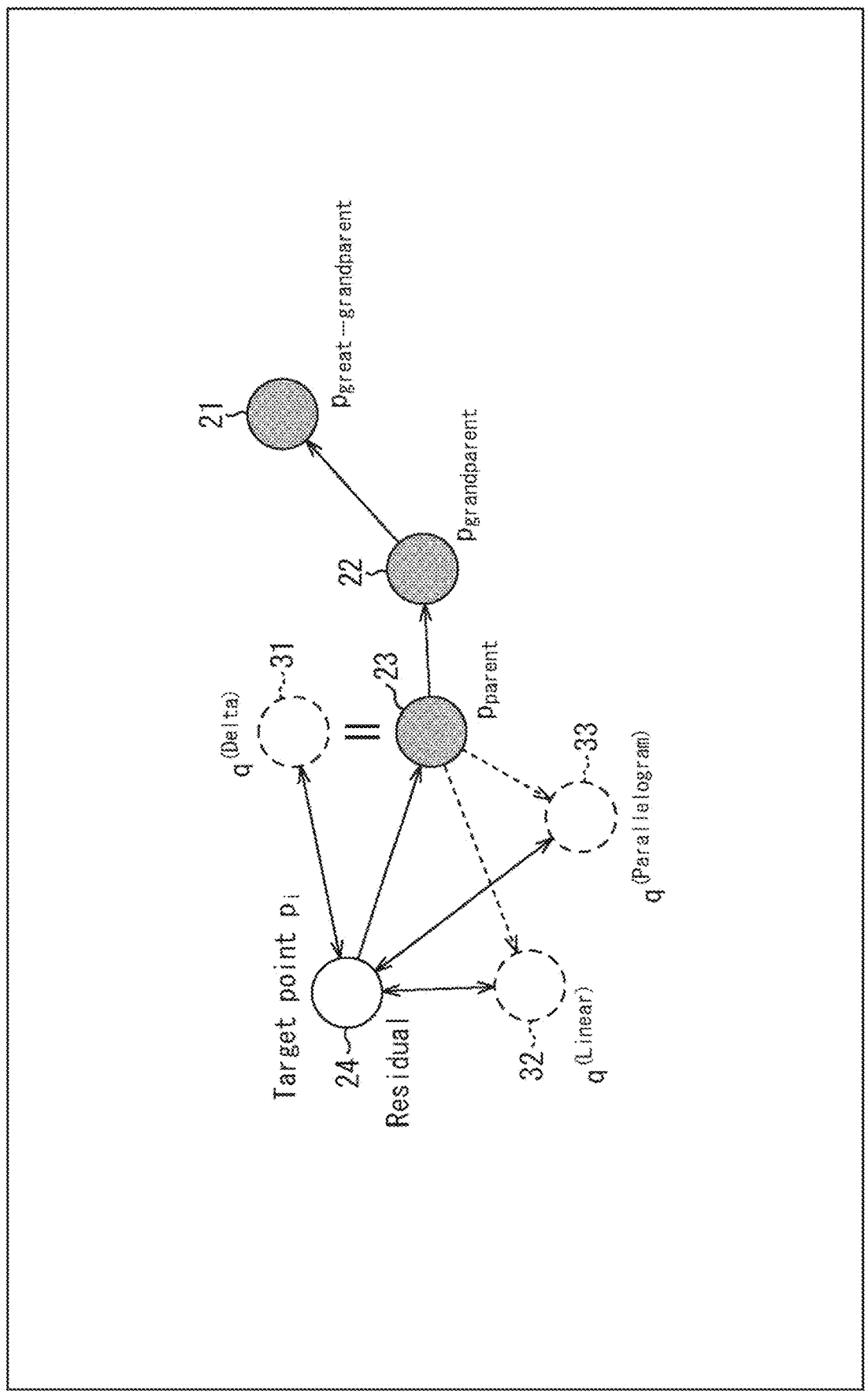
FIG. 2 is a diagram describing predictive geometry coding.

For example, in a reference structure such as points 21 to 24 in FIG. 2, it is assumed that the point 24 is set as a processing target point (Target point pi) and a predicted value of geometry data thereof is derived. In a first mode, the point 23 ($P_{parent}$) to which the point 24 refers in such a reference structure (also referred to as a parent node) is set as a prediction point 31 of the point 24, and geometry data of the prediction point 31 is set as a predicted value of geometry data of the point 24. The geometry data of the prediction point 31 (that is, the predicted value of the geometry data of the point 24 in the first mode) is referred to as $q^{(Delta)}$.

In a second mode, when the point 23 is set as a start point of an inverse vector of a reference vector having the point 23 as a start point and the point 22 ($P_{grandparent}$), which is a parent node of the point 23, as an end point (the arrow between the point 23 and the point 22) in such a reference structure, an end point of the inverse vector is set as a prediction point 32, and geometry data of the prediction point 32 is set as a predicted value of geometry data of the point 24. The geometry data of the prediction point 32 (that is, the predicted value of the geometry data of the point 24 in the second mode) is referred to as $q^{(Linear)}$.

In a third mode, when the point 23 is set as a start point of an inverse vector of a reference vector having the point 22 as a start point and the point 21 ($P_{great-grandparent}$), which is a parent node of the point 22, as an end point (the arrow between the point 22 and the point 21) in such a reference structure, an end point of the inverse vector is set as a prediction point 33, and geometry data of the prediction point 33 is set as a predicted value of geometry data of the point 24. The geometry data of the prediction point 33 (that is, the predicted value of the geometry data of the point 24 in the third mode) is referred to as $q^{(Parallelogram)}$.

In a fourth mode, the point 24 is set as a root point (Root vertex), and geometry data of another point is not referred to. That is, for the point 24, not a predictive residual but the geometry data of the point 24 is coded. In a case of the reference structure in an example in FIG. 2, this mode is excluded because the point 24 refers to the point 23.

A predictive residual (a difference from the geometry data of the point 24) is derived for a predicted value in each mode described above (three modes in a case of the example in FIG. 2), and a smallest predictive residual is selected. That is, a prediction point nearest to the point 24 is selected, and a predictive residual corresponding to the prediction point is selected.

By performing such processing for each point, the predictive residual of each point is derived. Then, the predictive residual is coded. With this arrangement, an increase in a coding amount can be reduced.

Figure 3A:
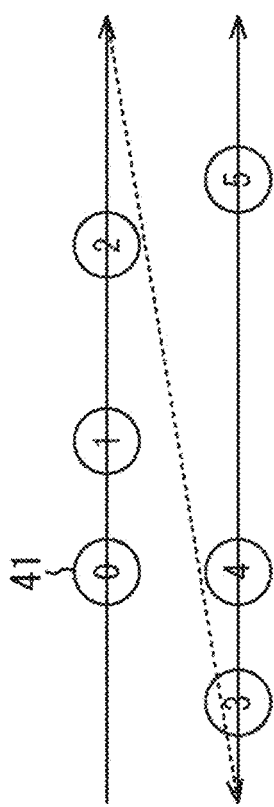
FIGS. 3A, 3B, and 3C are diagrams describing predictive geometry coding.
Figure 3C:
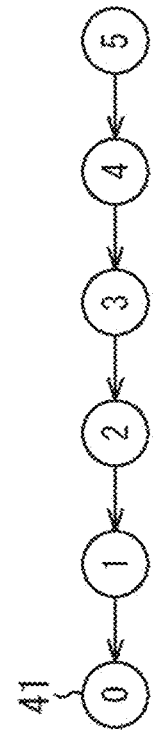
Figure 3B:
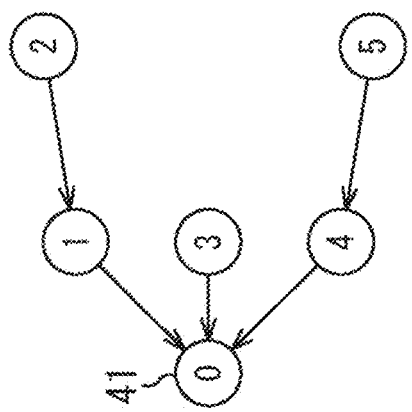

Note that, although the reference structure (prediction tree) is formed on the basis of a predetermined method, the formation method is arbitrary. For example, it is assumed that each point 41 is captured in an order illustrated in FIG. 3A. In FIGS. 3A, 3B, and 3C, a circle indicates a point, and the number in the circle indicates a capture order. In FIGS. 3A, 3B, and 3C, although only the point 41 of which capture order is 0 is denoted by a reference sign, all the circles in FIGS. 3A, 3B, and 3C are points 41. That is, in FIGS. 3A, 3B, and 3C, five points 41 of which capture orders are 0 to 5 are illustrated.

In such a case, for example, as in FIG. 3B, the reference structure may be formed such that each point refers to a nearest point (as a parent node). Encoding/decoding are performed according to the reference structure, and a child node (a node that refers to a processing target node) is searched for by using a stack. Therefore, a decoding order in this case is the point 41 with a capture order "0", the point 41 with a capture order "1", the point 41 with a capture order "3", the point 41 with a capture order "4", the point 41 with a capture order "5", and the point 41 with a capture order "2".

Furthermore, for example, as in FIG. 3C, the reference structure may be formed such that each point refers to a point of a previous capture order (as a parent node). The decoding order in this case is similar to the capture order.

<Quantization>

It is useful to control the coding amount generated in such coding. For example, there is a method for reducing the generated coding amount by quantizing the point cloud data before the coding. In a case of such quantization, information amount (that is, the generated coding amount) of the point cloud data can be controlled by changing a quantization step. That is, a degree of flexibility (fineness of control) of coding amount control in such quantization is an amount of change in the coding amount due to the quantization step changing by one.

Figure 4C:
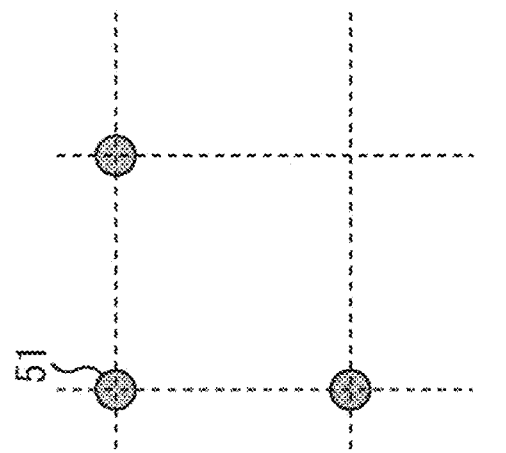
FIGS. 4A, 4B, and 4C are diagrams describing coding amount control by quantization.
Figure 4B:
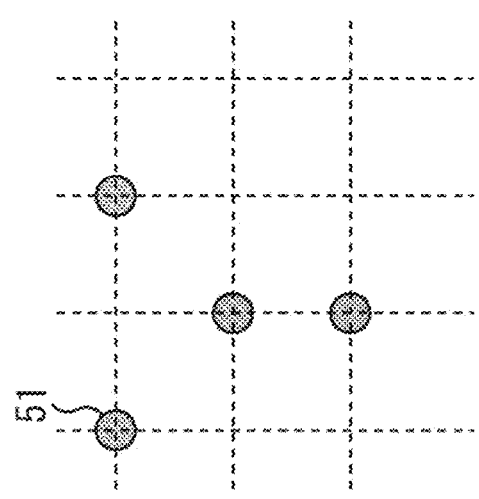
Figure 4A:
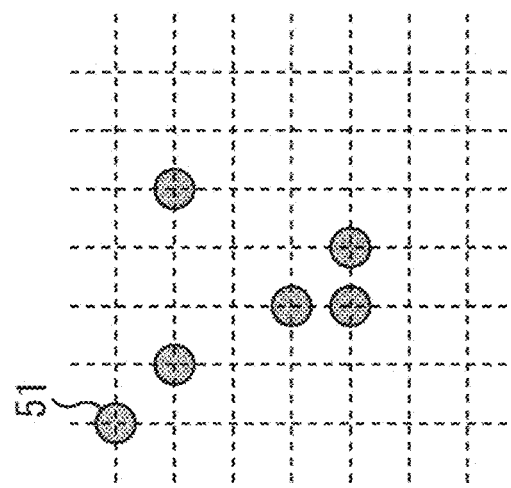

For example, a grid width (intervals between dotted lines) of positions of points 51 in a quantization step N-1 illustrated in FIG. 4B is twice a grid width of positions of points 51 in a quantization step N illustrated in FIG. 4A. A grid width of positions of points 51 in a quantization step N-2 illustrated in FIG. 4C is further doubled. That is, every time a quantization step decreases by one, the number of the points is reduced by one eighth at maximum.

In such quantization, this is a degree of flexibility of coding amount control, and it is difficult to perform control finer than this. Furthermore, because such quantization is performed as pre-processing of coding, such control is uniformly performed on an entire quantization target range without depending on a characteristic of coding (for example, a characteristic of the above-described predictive geometry coding). Therefore, in the predictive geometry coding, there is a possibility of occurrence of an error in a position of a point or reduction in the number of points, which reduces a decrease in coding amount. Moreover, complicating control is required to make the quantization target range finer, and the coding amount may increase, and thus, it is difficult to perform coding amount control more locally.

2. First Embodiment

<Correction of Geometry Data in Predictive Residual Coding>

Therefore, as described in the first row from the top of the table illustrated in FIG. 5, geometry data is corrected so that a coding amount decreases in coding using a predictive residual (Method 1). That is, the corrected geometry data is coded by using the predictive residual. The correction of the geometry data can be performed in units of points. Furthermore, the correction can be performed without increasing a grid width of point positions. Therefore, the coding amount can be controlled more locally than in a case of quantization. That is, the coding amount can be controlled more finely than in the case of the quantization. That is, it is possible to reduce a decrease in flexibility in controlling an amount of coding point cloud data.

In addition, because the coding amount can be controlled more locally, it is possible to reduce occurrence of unnecessary errors and a decrease in the number of points. Therefore, it is possible to reduce an increase in the coding amount while reducing deterioration in quality of the point cloud data. Furthermore, by correcting the geometry data so that a coding amount decreases in coding using a predictive residual, it is possible to reduce an increase in the coding amount due to coding amount control in coding using the predictive residual, such as predictive geometry coding, or the like. That is, the coding amount can be reduced more efficiently.

As described in the second row from the top of the table illustrated in FIG. 5, the correction may be performed according to a reference structure of the coding using the predictive residual (Method 1-1). That is, the geometry data may be corrected along the reference structure used for deriving a predicted value. With this arrangement, a coding characteristic can be utilized, and thus, the coding amount can be reduced more efficiently.

As described in the third row from the top of the table illustrated in FIG. 5, the correction may be performed within an allowable error (Method 1-2). That is, an allowable error (threshold values) indicating a range of allowable error may be provided, and correction may be performed within the allowable error. With this arrangement, a maximum value (maximum error) of an error caused by the coding amount control can be guaranteed. With this arrangement, unnecessary deterioration in quality of the point cloud data can be reduced.

<Coding Apparatus>

Figure 6:
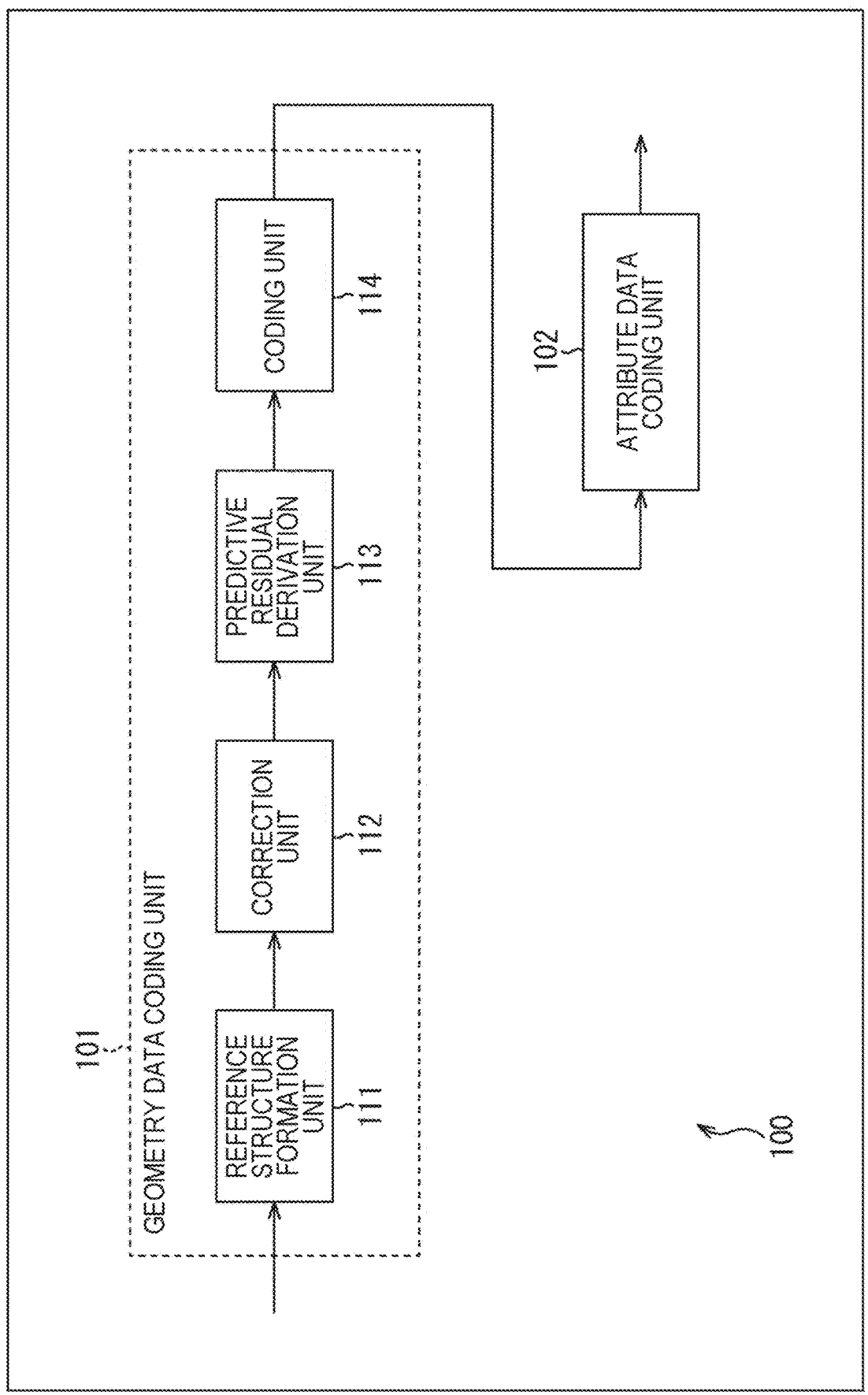
FIG. 6 is a block diagram illustrating a main configuration example of a coding apparatus.

FIG. 6 is a block diagram illustrating an example of a configuration of a coding apparatus that is an aspect of an information processing apparatus to which the present technology is applied. A coding apparatus 100 illustrated in FIG. 6 is an apparatus that codes a point cloud (3D data). The coding apparatus 100 codes a point cloud by applying the present technology (for example, the method illustrated in FIG. 5, or the like).

Note that FIG. 6 illustrates a main configuration including processing units, data flows, and the like, and the processing units and data flows illustrated in FIG. 6 are not necessarily all. That is, in the coding apparatus 100, there may be a processing unit not illustrated as a block in FIG. 6, or there may be processing or data flow not illustrated as an arrow, or the like, in FIG. 6.

As illustrated in FIG. 6, the coding apparatus 100 includes a geometry data coding unit 101 and an attribute data coding unit 102.

The geometry data coding unit 101 acquires the point cloud (3D data) input to the coding apparatus 100. The geometry data coding unit 101 codes the geometry data (position information) and generates coded data of the geometry data. At that time, as described above with reference to FIG. 5, the geometry data coding unit 101 corrects the geometry data so that the coding amount decreases in coding using the predictive residual. Then, the geometry data coding unit 101 derives a predictive residual by using the corrected geometry data, and codes the predictive residual. Furthermore, the geometry data coding unit 101 supplies the attribute data coding unit 102 with the generated coded data of the geometry data and attribute data (attribute information).

The geometry data coding unit 101 includes a reference structure formation unit 111, a correction unit 112, a predictive residual derivation unit 113, and a coding unit 114.

The reference structure formation unit 111 performs processing related to formation of the reference structure. For example, the reference structure formation unit 111 acquires the point cloud data input to the geometry data coding unit 101. The reference structure formation unit 111 forms a reference structure (prediction tree) in point cloud coding (for example, predictive geometry coding) using the predictive residual for geometry data of the acquired point cloud data. The reference structure formation unit 111 supplies the correction unit 112 with information indicating the formed reference structure, the geometry data, and the attribute data.

The correction unit 112 performs processing related to correction of the geometry data. For example, the correction unit 112 acquires the information indicating the reference structure, the geometry data, and the attribute data that are supplied from the reference structure formation unit 111. The correction unit 112 corrects the geometry data so that the coding amount decreases in coding using the predictive residual (for example, predictive geometry coding). At that time, for example, the correction unit 112 may correct the geometry data along the reference structure formed by the reference structure formation unit 111. Furthermore, the correction unit 112 may perform the correction within a preset allowable error (that is, the geometry data is corrected so that an error is equal to or less than a predetermined threshold value). The correction unit 112 supplies the predictive residual derivation unit 113 with the information indicating the reference structure, the corrected geometry data, and the attribute data.

The predictive residual derivation unit 113 performs processing related to derivation of the predictive residual. For example, the predictive residual derivation unit 113 acquires the information indicating the reference structure, the corrected geometry data, and the attribute data that are supplied from the correction unit 112. The predictive residual derivation unit 113 derives a predicted value of the geometry data of a current point, which is a processing target, and derives a predictive residual, which is a difference between the geometry data and a predicted value thereof. At that time, the predictive residual derivation unit 113 derives a predictive residual in a plurality of candidate prediction modes as illustrated in FIG. 2, for example, and selects an optimum prediction mode from among the plurality of candidates. For example, the predictive residual derivation unit 113 derives a predictive residual (a difference between geometry data of the current point and a predicted value thereof) for each prediction mode, and selects a prediction mode in which the predictive residual is minimum. The predictive residual derivation unit 113 selects a prediction mode for all points as described above according to the information indicating the reference structure. The predictive residual derivation unit 113 supplies the coding unit 114 with the predictive residual of the prediction mode selected for each point as a predictive residual of the geometry data, together with the attribute data.

The coding unit 114 performs processing related to coding. For example, the coding unit 114 acquires the predictive residual of the geometry data and the attribute data that are supplied from the predictive residual derivation unit 113. The coding unit 114 codes the predictive residual of the geometry data to generate coded data of the geometry data. The coding unit 114 supplies the attribute data coding unit 102 with the generated coded data of the geometry data, together with the attribute data.

The attribute data coding unit 102 acquires the coded data of the geometry data and the attribute data that are supplied from the geometry data coding unit 101. The attribute data coding unit 102 codes the attribute data by using them and generates coded data of the attribute data. The attribute data coding unit 102 outputs, to outside of the coding apparatus 100 (to a decoding side, for example), the coded data of the geometry data and the generated coded data of the attribute data, as coded data of the point cloud data.

Note that these processing units (the geometry data coding unit 101 and the attribute data coding unit 102) have an arbitrary configuration. For example, each of the processing units may include a logic circuit that achieves the above-described processing. Furthermore, each of the processing units may have, for example, a central processing unit (CPU), a read only memory (ROM), a random access memory (RAM), and the like, and execute a program by using the CPU, the ROM, the RAM, and the like to achieve the above-described processing. Needless to say, each of the processing units may have both the configurations and part of the above-described processing may be achieved by the logic circuit, and another may be achieved by executing the program. Configurations of the processing units may be independent from each other, and, for example, among the processing units, some processing units may achieve part of the above-described processing with a logic circuit, some other processing units may achieve the above-described processing by executing a program, and still some other processing units may achieve the above-described processing with both a logic circuit and execution of a program.

With the above configuration, the coding apparatus 100 can control the coding amount more finely than in a case of the quantization, and thus, it is possible to reduce a decrease in flexibility in controlling the amount of coding the point cloud data. Furthermore, because the coding apparatus 100 can control the coding amount more locally, it is possible to reduce an increase in the coding amount while reducing deterioration in quality of the point cloud data. Moreover, the coding apparatus 100 can reduce an increase in the coding amount due to coding amount control in coding using the predictive residual, and thus, the coding amount can be reduced more efficiently.

Furthermore, by correcting the geometry data according to the reference structure of the coding using the predictive residual, the coding apparatus 100 can utilize the coding characteristic, and thus, the coding amount can be reduced more efficiently. Moreover, by providing an allowable error (threshold values) indicating a range of allowable error and performing correction within the allowable error, the coding apparatus 100 can guarantee a maximum error and reduce unnecessary deterioration in quality of the point cloud data.

<Flow of Coding Processing>

Next, processing executed by the coding apparatus 100 will be described. The coding apparatus 100 codes data of the point cloud by executing coding processing. An example of a flow of the coding processing will be described with reference to the flowchart in FIG. 7.

When the coding processing starts, the geometry data coding unit 101 of the coding apparatus 100 executes geometry data coding processing in Step S101, thereby coding geometry data of the input point cloud to generate coded data of the geometry data.

In Step S102, the attribute data coding unit 102 codes attribute data of the input point cloud to generate coded data of the attribute data.

When the processing in Step S102 ends, the coding processing ends.

<Flow of Geometry Data Coding Processing>

Next, an example of a flow of geometry data coding processing executed in Step S101 in FIG. 7 will be described with reference to the flowchart in FIG. 8.

When the geometry data coding processing starts, the reference structure formation unit 111 forms a reference structure (prediction tree) of the geometry data in Step S121.

In Step S122, the correction unit 112 performs correction processing, and corrects the geometry data so that the coding amount decreases in coding using the predictive residual (for example, predictive geometry coding).

In Step S123, the predictive residual derivation unit 113 derives a predicted value of the corrected geometry data, and derives a predictive residual that is a difference between the geometry data and the predicted value thereof.

In Step S124, the coding unit 114 codes the derived predictive residual of the geometry data to generate coded data of the geometry data.

Figure 7:
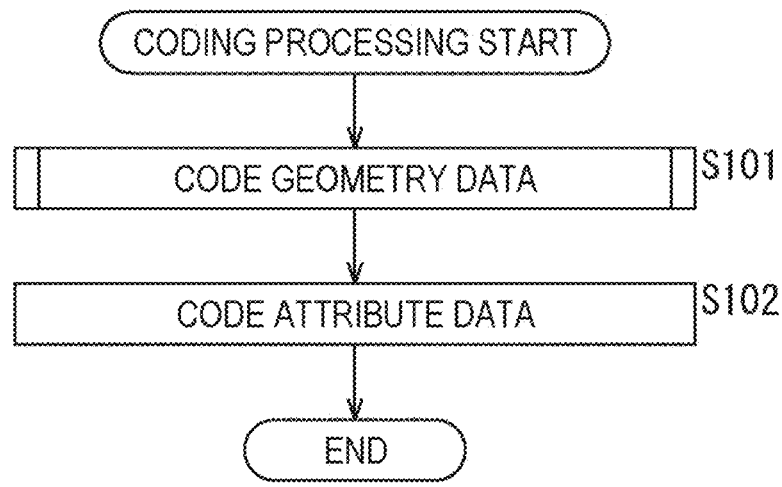
FIG. 7 is a flowchart describing an example of a flow of coding processing.

When the processing in Step S124 ends, the geometry data coding processing ends, and the processing returns to FIG. 7.

By executing each processing as described above, the coding apparatus 100 can control the coding amount more finely than in a case of the quantization, and thus, it is possible to reduce a decrease in flexibility in controlling the amount of coding the point cloud data. Furthermore, because the coding apparatus 100 can control the coding amount more locally, it is possible to reduce an increase in the coding amount while reducing deterioration in quality of the point cloud data. Moreover, the coding apparatus 100 can reduce an increase in the coding amount due to coding amount control in coding using the predictive residual, and thus, the coding amount can be reduced more efficiently.

Furthermore, by correcting the geometry data according to the reference structure of the coding using the predictive residual, the coding apparatus 100 can utilize the coding characteristic, and thus, the coding amount can be reduced more efficiently. Moreover, by providing an allowable error (threshold values) indicating a range of allowable error and performing correction within the allowable error, the coding apparatus 100 can guarantee a maximum error and reduce unnecessary deterioration in quality of the point cloud data.

3. Second Embodiment

<Resampling>

As described in the fourth row from the top of the table illustrated in FIG. 5, resampling (resampling) of points may be performed as correction of geometry data (Method 1-3). For example, a coding amount may be reduced by integrating a plurality of points to generate one point (that is, by reducing the number of points). With this arrangement, the coding amount can be reduced in units of points, and thus, the coding amount can be controlled more finely than in a case of quantization. For example, by controlling how many points are integrated, it is possible to control how much the coding amount is reduced. That is, it is possible to reduce a decrease in flexibility in controlling an amount of coding point cloud data.

In addition, the coding amount can be controlled more locally. Furthermore, a grid width of point positions can be maintained (geometry data can be corrected without increasing the grid width), and thus, the geometry data can be corrected with finer accuracy. Therefore, it is possible to reduce occurrence of unnecessary errors and a decrease in the number of points. Therefore, it is possible to reduce an increase in the coding amount while reducing deterioration in quality of the point cloud data.

A method for resampling (a method for integrating a plurality of points) is arbitrary. For example, two points may be integrated and converted into one point positioned at a middle point (midpoint) between them. Needless to say, resampling may be performed at a position other than the midpoint. Furthermore, a plurality of three or more points may be integrated and converted into one point positioned at a centroid thereof. Needless to say, resampling may be performed at a position other than the centroid. Moreover, N number of points may be integrated and converted into (N-1)

number of points or less. Needless to say, the integration may be performed with a method other than these methods. Thus, there are a wide range of options of a rate of the number of the points to be reduced by the integration and point positions after the resampling. That is, it is possible to reduce a decrease in flexibility in controlling an amount of coding point cloud data.

As described in the fifth row from the top of the table illustrated in FIG. 5, resampling of such points may be performed according to a reference structure of coding using a predictive residual (Method 1-3-1). That is, the resampling may be performed along the reference structure used for deriving a predicted value.

Figure 9A:
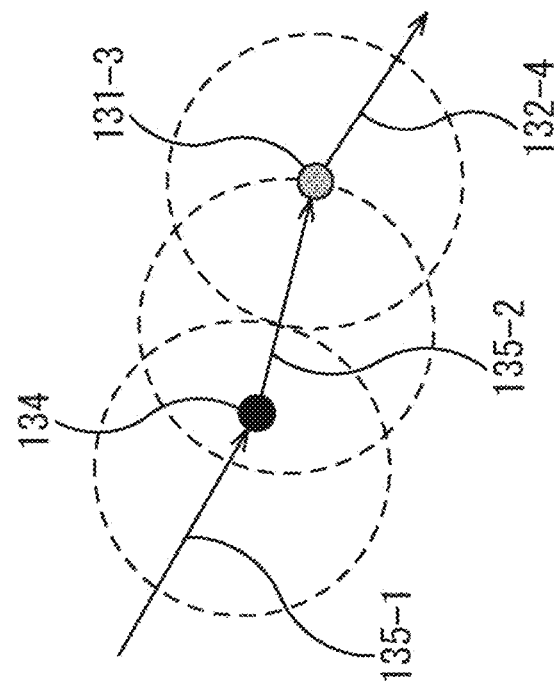
FIGS. 9A and 9B are diagrams describing resampling.
Figure 9B:
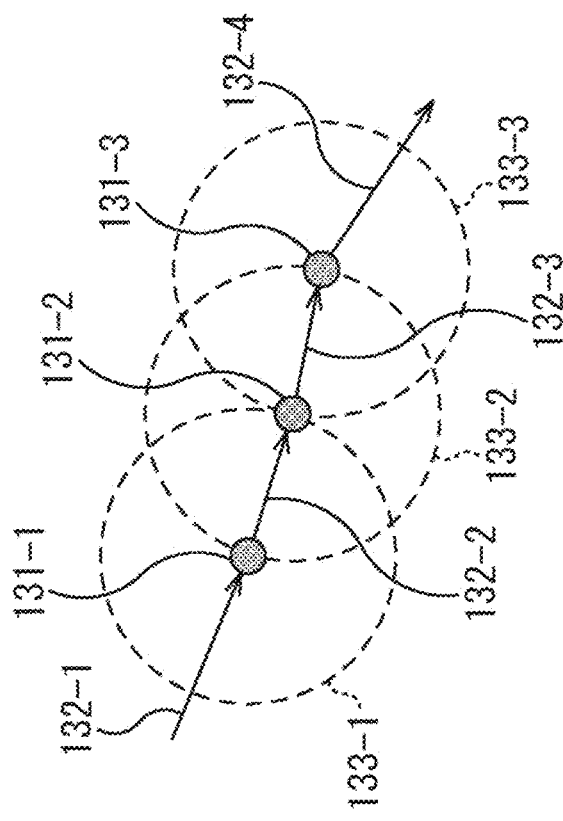

For example, in FIG. 9A, it is assumed that points 131-1 to 131-3 have a reference relation as indicated by arrows 132-1 to 132-4 in predictive geometry coding. The points 131-1 and 131-2 in such a relation of a reference source and a reference destination (arrow 132-2) may be resampled to a point 134 positioned at a midpoint between them as illustrated in FIG. 9B. That is, two consecutive points in the reference structure (two points one of which refers to the other) may be resampled to one point (for example, a midpoint of the two points).

Note that, after such resampling, a reference relation with surrounding points (arrows 135-1 and 135-2) is established for the integrated point 134 (reference structure is reformed). By performing resampling along the reference structure in this manner, it is possible to reduce effects of other points on the reference structure, and thus, it is easier to reform the reference structure after the resampling.

Furthermore, the reference structure is constructed such that neighboring points are referred to each other so as to reduce an increase in the coding amount. Therefore, neighboring points can be integrated by performing resampling along the reference structure. With this arrangement, an increase in change in the geometry data due to the resampling can be reduced, and deterioration in quality of the point cloud data can be reduced.

Note that all or some of the points may be such resampling targets. When resampling is performed a plurality of times while changing a target point, the target may be changed in an order from a parent node to a child node in the reference structure. Because a predictive residual of the child node is also affected when the parent node is resampled, derivation of a predictive residual (selection of a prediction mode) is easier if the resampling is performed in such order.

In that case, in FIG. 9A for example, after resampling the points 131-1 and 131-2, the integrated point 134 and a point 131-3 as a child node thereof may be processing targets of next resampling (FIG. 9B).

Figure 10B:
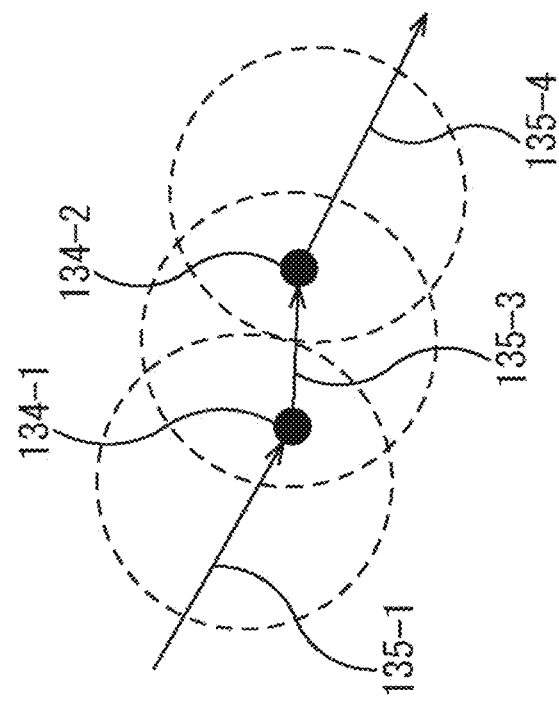
FIGS. 10A and 10B are diagrams describing the resampling.

Furthermore, resampling may be performed on the points 131-1 and 131-2 as processing targets (FIG. 10A) to derive a point 134-1 (FIG. 10B), and then resampling may be performed on the points 131-2 and 131-3 as processing targets (FIG. 10B) to derive a point 134-2 (FIG. 10B). Furthermore, resampling may be performed on the points 131-1 to 131-3 in FIG. 10A (that is, three consecutive points along the reference structure) as processing targets to derive points 134-1 and 134-2 in FIG. 10B.

Note that the resampling may not be performed according to the reference structure. For example, as illustrated in FIG. 11A, three neighboring points (points 141-1 to 141-3) may be resampled as processing targets regardless of the reference structure, and integrated into a point 143 illustrated in FIG. 11B. For example, the point 143 may be derived to the centroid of the points 141-1 to 141-3. For example, some points may be resampled according to the reference structure, and other points may be resampled regardless of the reference structure. Thus, because the resampling can be performed with various methods, it is possible to reduce a decrease in flexibility in controlling the amount of coding the point cloud data.

As described in the sixth row from the top of the table illustrated in FIG. 5, resampling of such points may be performed within an allowable error (Method 1-3-2). That is, an allowable error (threshold values) indicating a range of allowable error may be provided, and resampling may be performed within the allowable error.

For example, a maximum allowable error is Th. Because a magnitude of an error can be indicated by a distance from a point before correction, in a case of an example in FIG. 9A, allowable error ranges of the points 131-1 to 131-3 are indicated by dotted circles each having a radius Th centered on each of the points, as ranges 133-1 to 133-3. That is, resampling can be performed only within a range included in both dotted circles of a plurality of points to be resampled. For example, when the points 131-1 and 131-2 are integrated in FIG. 9A, the point 134 is disposed in a region included in both the range 133-1 and the range 133-2 as illustrated in FIG. 9B.

Figure 10A:
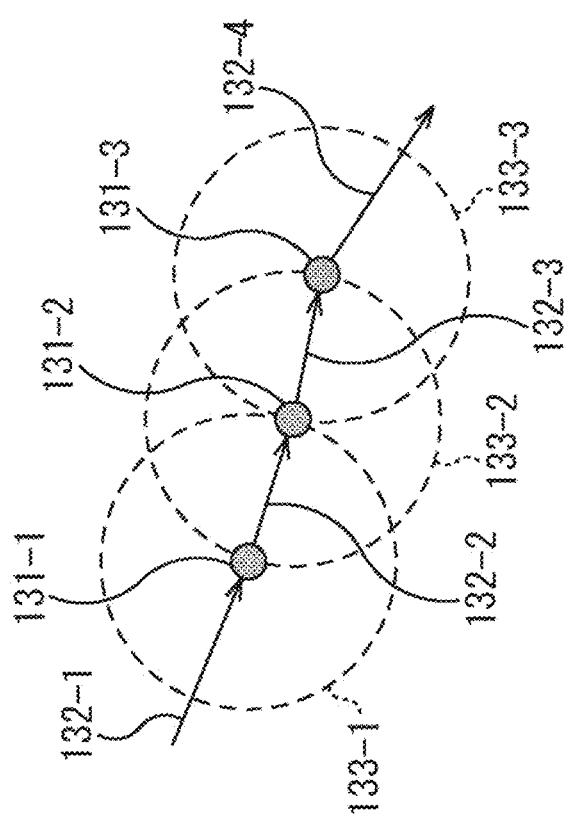

Similarly, the point 134-1 obtained by integrating the points 131-1 and 131-2 in FIG. 10A is disposed in a region where the range 133-1 and the range 133-2 overlap each other as illustrated in FIG. 10B. The point 134-2 obtained by integrating the points 131-2 and 131-3 in FIG. 10A is disposed in a region where the range 133-2 and the range 133-3 overlap each other as illustrated in FIG. 10B.

In other words, resampling can be performed only when a distance between two points to be resampled is equal to or less than Th x 2. That is, by providing a maximum allowable error, an interval between points within which resampling can be performed is limited (only two points having an inter-point distance equal to or less than a predetermined threshold value can be integrated).

Figure 11B:
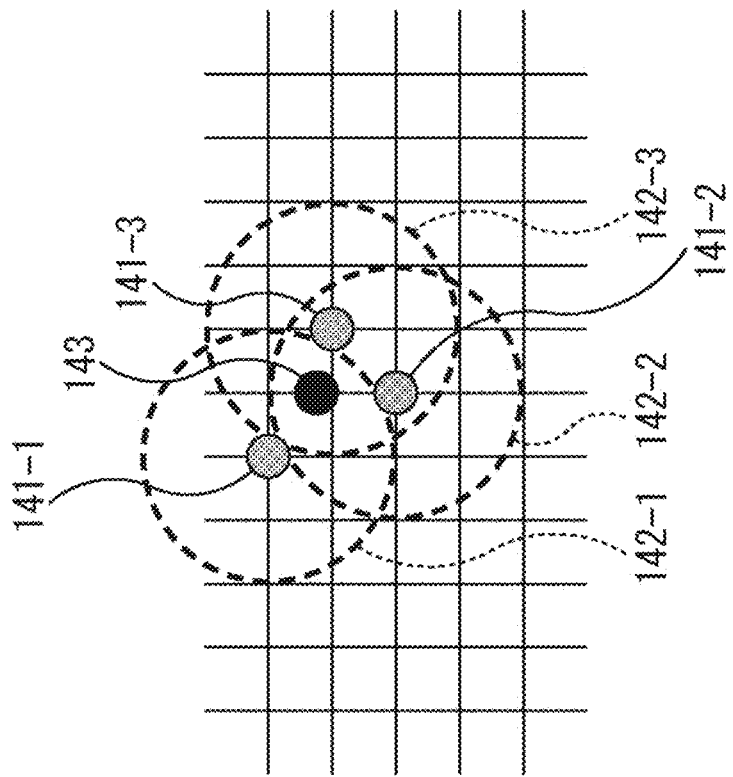
FIGS. 11A and 11B are diagrams describing the resampling.
Figure 11A:
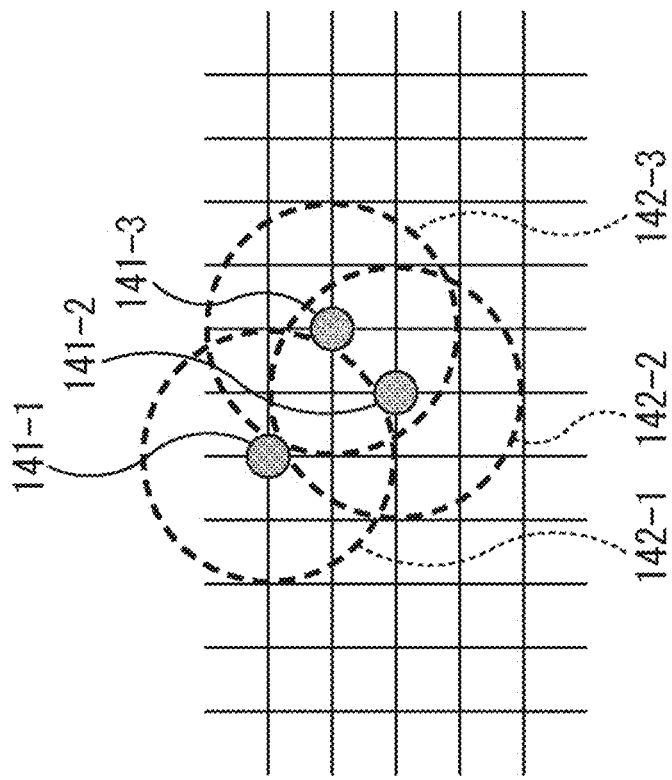

A similar applies to a case where three points are resampled as in an example in FIGS. 11A and 11B. In FIG. 11A, allowable error ranges of the points 141-1 to 141-3 are set as ranges 142-1 to 142-3, respectively. The point 143 obtained by integrating the points 141-1 to 141-3 is disposed in a region where the ranges 142-1 to 142-3 overlap with one another as illustrated in FIG. 11B.

In other words, by providing a maximum allowable error in this manner, an interval between points within which resampling can be performed is limited (only a plurality of points having an inter-point distance equal to or less than a predetermined threshold value can be integrated).

Thus, it is possible to guarantee a maximum error by limiting a position of a point after integration within a predetermined range based on point positions before the integration. With this arrangement, unnecessary deterioration in quality of the point cloud data can be reduced.

Note that resampling may be performed only when the coding amount is reduced to a predetermined threshold value or more by the resampling. In other words, resampling may not be performed for a point for which an amount (or degree) of reducing the coding amount is (or is expected to be) smaller than a threshold value thereof even of the resampling is performed. With this arrangement, resampling can be performed only for a point for which a sufficient effect can be (or is expected to be) obtained (resampling with which a sufficient effect cannot be (or is expected not to be) obtained can be omitted), and thus it is possible to reduce an increase in load.

As described in the seventh row from the top of the table illustrated in FIG. 5, attribute data may be defined for a point obtained by resampling (Method 1-3-3). As described above, by resampling, a plurality of points as processing targets is integrated to generate a new point. Attribute data may be defined for the point after the integration. With this arrangement, attribute data that is more accurate (more suitable for the geometry data) can be coded.

<Correction Unit>

FIG. 12 is a block diagram illustrating a main configuration example of a correction unit 112 in this case. Note that FIG. 12 illustrates a main configuration including processing units, data flows, and the like, and the processing units and data flows illustrated in FIG. 12 are not necessarily all. That is, in the correction unit 112, there may be a processing unit not illustrated as a block in FIG. 12, or there may be processing or data flow not illustrated as an arrow, or the like, in FIG. 12.

As illustrated in FIG. 12, the correction unit 112 of a geometry data coding unit 101 includes a reference structure holding unit 201, a stack 202, a resampling candidate extraction unit 203, a resampling unit 204, and an attribute definition unit 205.

The reference structure holding unit 201 performs processing related to holding of the reference structure. For example, the reference structure holding unit 201 acquires and stores geometry data and information indicating the reference structure that are supplied from a reference structure formation unit 111. The reference structure holding unit 201 supplies the stack 202 with the geometry data of each point according to the reference structure, and causes the stack 202 to store the geometry data. Furthermore, according to the reference structure, the reference structure holding unit 201 supplies the resampling candidate extraction unit 203 with information (geometry data) of nodes, the information being necessary for processing.

The stack 202 holds information in a last-in, first-out manner. For example, the stack 202 holds the geometry data of each point, the geometry data being supplied from the reference structure holding unit 201. Furthermore, in response to a request from the resampling candidate extraction unit 203, the stack 202 supplies the resampling candidate extraction unit 203 with last held information (geometry data) among the information held.

The resampling candidate extraction unit 203 performs processing related to extraction of a point as a candidate to be resampled. For example, from the stack 202, the resampling candidate extraction unit 203 reads geometry data of the point to be processed (current node). Furthermore, from the reference structure holding unit 201, the resampling candidate extraction unit 203 acquires geometry data of nodes that may be resampling targets other than the current node. The resampling candidate extraction unit 203 uses those nodes to set a combination (subset) as a candidate to be resampled, and derives a centroid of each subset. The resampling candidate extraction unit 203 supplies the resampling unit 204 with information of each set subset (information indicating nodes belonging to each subset, geometry data of each node, or the like). The resampling candidate extraction unit 203 repeats the above-described processing until the stack 202 becomes empty or a predetermined number of points are processed.

The resampling unit 204 performs processing related to resampling. For example, the resampling unit 204 acquires information of each subset of the current node, the information being supplied from the resampling candidate extraction unit 203. The resampling unit 204 resamples each subset. The resampling unit 204 supplies a resampling result to a predictive residual derivation unit 113. Furthermore, the resampling unit 204 supplies the resampling result to the attribute definition unit 205 also. The resampling unit 204 performs the above-described processing on all nodes supplied from the resampling candidate extraction unit 203.

The attribute definition unit 205 performs processing related to definition of attribute data. For example, from the resampling unit 204, the attribute definition unit 205 acquires the resampling result, that is, geometry data of the (integrated) point obtained as a result of the resampling. Furthermore, the attribute definition unit 205 acquires the attribute data supplied from the reference structure formation unit 111. The attribute definition unit 205 defines attribute data for the point. For example, by using attribute data of a point positioned around the point, the attribute definition unit 205 defines attribute data of the point (for example, with a weighted average according to a distance, or the like). Thus, the attribute definition unit 205 defines attribute data for all resampling results (integrated points) supplied from the resampling unit 204. The attribute definition unit 205 supplies the predictive residual derivation unit 113 with the attribute data updated as described above.

Note that these processing units (the reference structure holding unit 201 to the attribute definition unit 205) have any configuration. For example, each of the processing units may include a logic circuit that achieves the above-described processing. Furthermore, each of the processing units may have, for example, a CPU, a ROM, a RAM, and the like, and execute a program by using the CPU, the ROM, the RAM, and the like to achieve the above-described processing. Needless to say, each of the processing units may have both the configurations and part of the above-described processing may be achieved by the logic circuit, and another may be achieved by executing the program. Configurations of the processing units may be independent from each other, and, for example, among the processing units, some processing units may achieve part of the above-described processing with a logic circuit, some other processing units may achieve the above-described processing by executing a program, and still some other processing units may achieve the above-described processing with both a logic circuit and execution of a program.

With such a configuration, the correction unit 112 can perform resampling as correction of the geometry data. Furthermore, the correction unit 112 can perform resampling according to the reference structure. Moreover, the correction unit 112 can perform resampling within an allowable error. Furthermore, the correction unit 112 can define attribute data for a point obtained as a result of the resampling. Therefore, in <Resampling>, the correction unit 112 can obtain an above-described effect. Therefore, a coding apparatus 100 can reduce a decrease in flexibility in controlling an amount of coding the point cloud data.

<Flow of Correction Processing>

Next, an example of a flow of correction processing executed by the correction unit 112 in this case in Step S112 in FIG. 8 will be described with reference to the flowchart in FIG. 13.

When the correction processing starts, in Step S201, the reference structure holding unit 201 acquires and stores geometry data and information indicating the reference structure that are supplied from the reference structure formation unit 111. Then, the reference structure holding unit 201 supplies the stack 202 with geometry data of a head node of the reference structure. The stack 202 holds the geometry data.

In Step S202, the resampling candidate extraction unit 203 initializes (for example, 0) a value of a variable cnt. In this case, the correction unit 112 has preset the number of nodes Num to be resampled. That is, the correction unit 112 resamples up to Num of nodes. If a value of Num is set to a value larger than the number of points of the point cloud data (the number of nodes of the reference structure), the correction unit 112 performs resampling for all the points of the point cloud data. The variable cnt is a variable for counting the number of resampled nodes for such control.

In Step S203, the resampling candidate extraction unit 203 reads, from the stack 202, the geometry data of a node last held by the stack 202. The resampling candidate extraction unit 203 sets the node as the current node.

In Step S204, according to the reference structure held by the reference structure holding unit 201, the resampling candidate extraction unit 203 determines whether or not the number of the child nodes of the current node is 0. When it is determined that the number of child nodes is not 0, the processing proceeds to Step S205.

In Step S205, the resampling candidate extraction unit 203 performs resampling candidate extraction processing and extracts a combination (subset) of points as a candidate to be resampled.

In Step S206, the resampling unit 204 executes resampling processing, and performs resampling for each subset.

In Step S207, the attribute definition unit 205 defines attribute data for an integrated point obtained as a result of the resampling in Step S206.

In Step S208, the resampling candidate extraction unit 203 determines whether or not the resampling has been performed. When it is determined that the resampling has been performed, the processing returns to Step S205, and the subsequent processing is repeated. That is, resampling is tried again. That is, the processing in Steps S205 to S208 is repeatedly executed until the resampling is not performed. When it is determined in Step S208 that the resampling has not been performed, the processing proceeds to Step S209.

In Step S209, the resampling candidate extraction unit 203 increments the value of the variable cnt by (+1). That is, the current node is counted as processed.

In Step S210, the reference structure holding unit 201 supplies the stack 202 with geometry data of the child node of the current node. The stack 202 holds the geometry data. When the processing in Step S210 ends, the processing proceeds to Step S211.

Furthermore, when it is determined in Step S204 that the number of child nodes of the current node is 0 (that is, the current node is a leaf node in the reference structure), the processing in Steps S205 to S210 is omitted, and the processing proceeds to Step S211.

In Step S211, the resampling candidate extraction unit 203 determines whether or not the stack 202 is empty or the variable cnt has reached Num. The stack being empty means that all points of the point cloud data have been processed. Furthermore, the variable cnt having reached Num means that the number of resampled nodes has reached an upper limit.

When it is determined that the geometry data is held in the stack 202 and that the variable cnt has not reached Num, that is, when it is determined that there is an unprocessed point and that the number of resampled nodes has not reached the upper limit, the processing returns to Step S203, and the subsequent processing is repeated. That is, the processing in Steps S203 to S211 is repeatedly executed until it is determined that the stack is empty or the variable cnt reaches Num.

Figure 8:
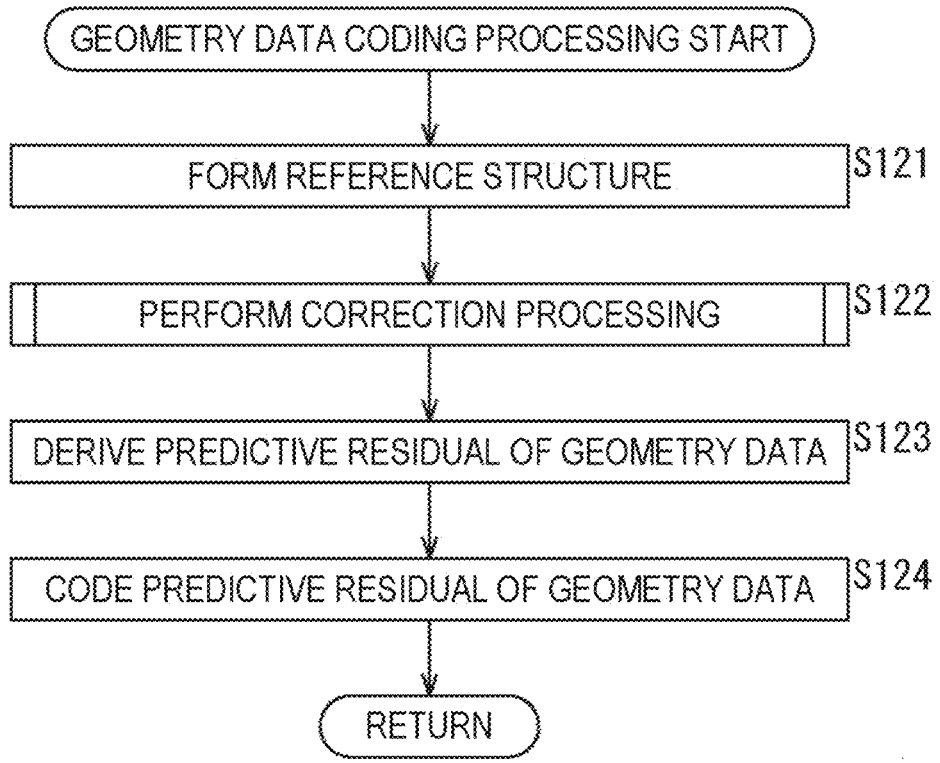
FIG. 8 is a flowchart describing an example of a flow of geometry data coding processing.

When it is determined that the stack 202 is empty or that the variable cnt has reached Num, that is, when it is determined that all the points of the point cloud data have been processed, or that the number of resampled nodes has reached the upper limit, the correction processing ends and the processing returns to FIG. 8.

<Flow of Resampling Candidate Extraction Processing>

Next, an example of a flow of resampling candidate extraction processing executed in Step S205 in FIG. 13 will be described with reference to the flowchart in FIG. 14.

When the resampling candidate extraction processing starts, the resampling candidate extraction unit 203 extracts K patterns of subsets from a target in Step S231. K is any natural number. That is, a predetermined number of patterns of subsets are extracted.

Except for the already resampled point, the resampling candidate extraction unit 203 extracts, as a subset, a combination of two or more points that may be selected from a target point group decided according to the reference structure, the combination having a distance between a centroid of the selected point and each point being within a predetermined threshold value.

The point group for which the subset is defined is decided according to the reference structure, as in the table illustrated in FIG. 15, for example. For example, as in the row "1" in the table, a current node and a child node of the current node may be targeted. Furthermore, as in the row "2" in the table, a child node of the current node may be targeted. Moreover, as in the row "3" in the table, the current node, the child node of the current node, and a parent node of the current node may be targeted. Furthermore, as in the row "4" in the table, the current node, the child node of the current node, the parent node of the current node, and a parent node of the parent node of the current node may be targeted. Needless to say, a combination other than these examples may be used, or another node may be targeted.

Returning to FIG. 14, in Step S232, the resampling candidate extraction unit 203 derives a centroid of the extracted subset. That is, for each subset, a centroid of the point group belonging to the subset is derived.

Figure 13:
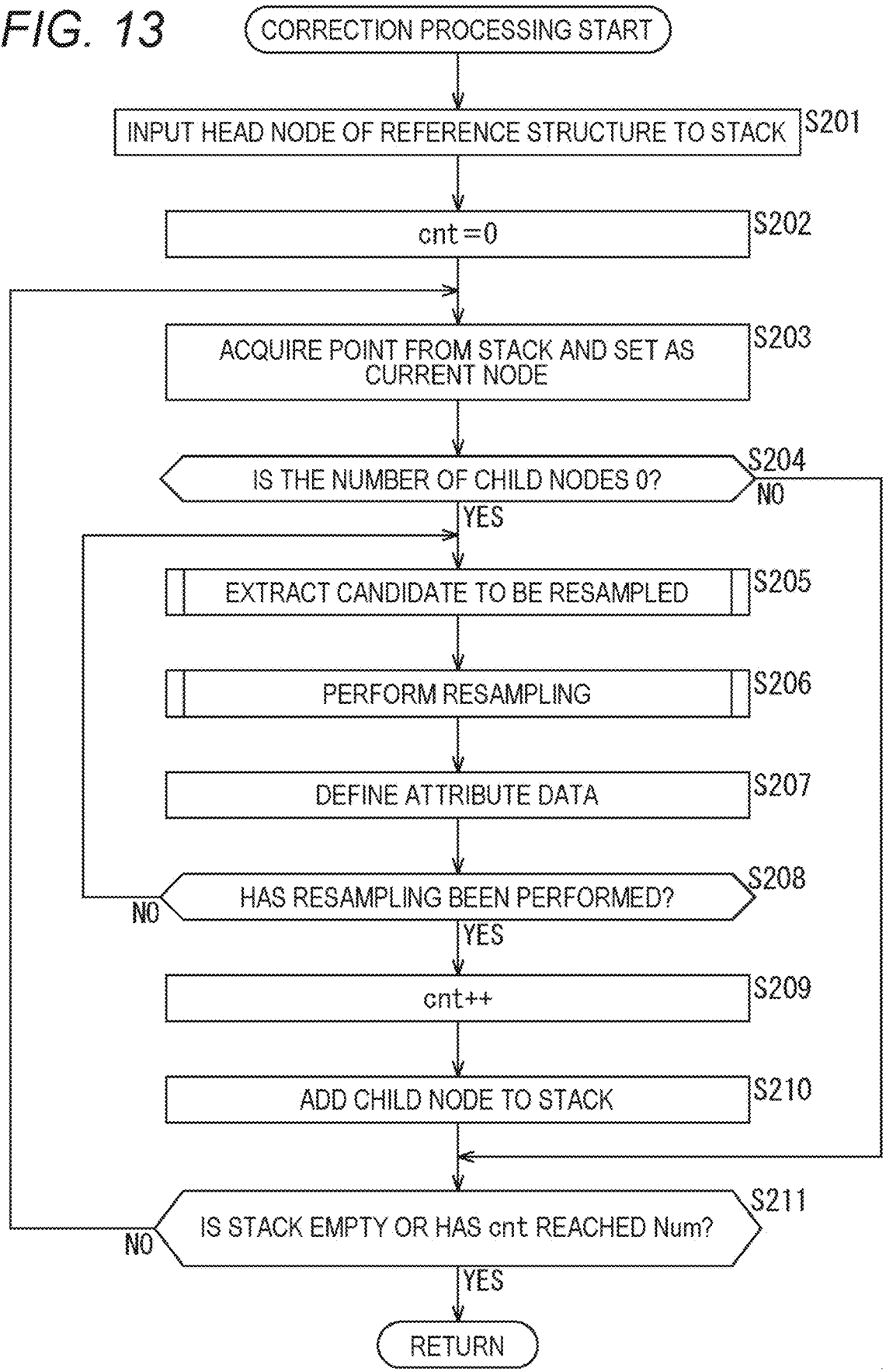
FIG. 13 is a flowchart describing an example of a flow of correction processing.
Figure 14:
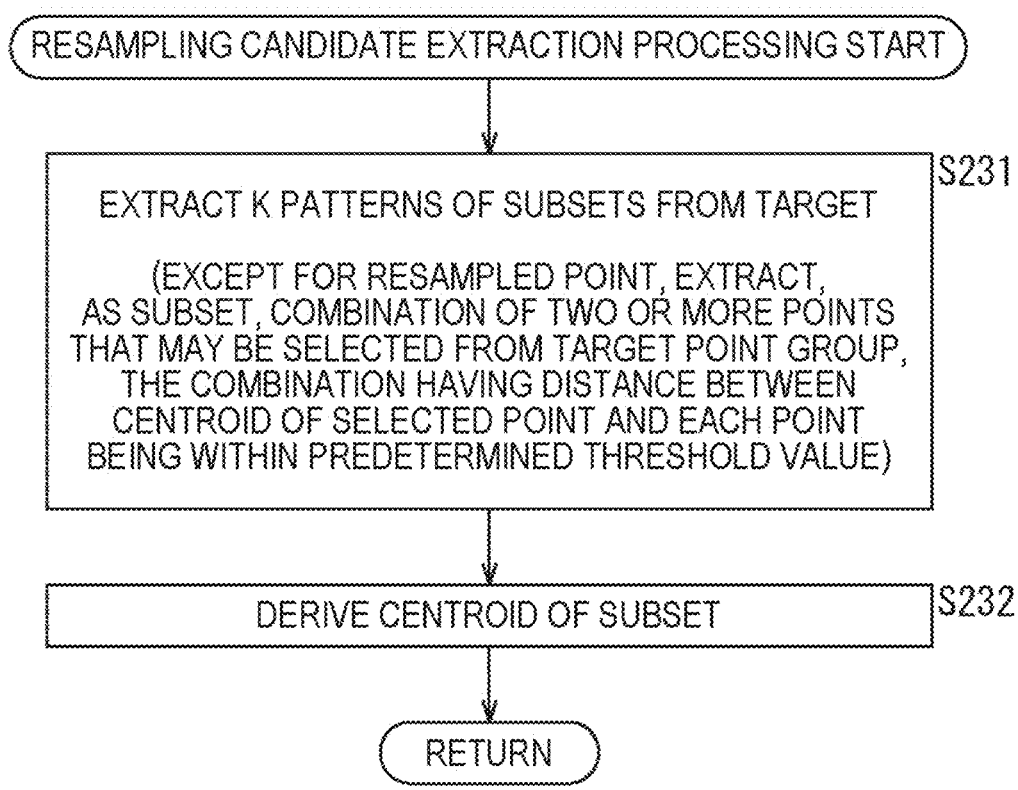
FIG. 14 is a flowchart describing an example of a flow of resampling candidate extraction processing.

When the processing in Step S232 ends, the resampling candidate extraction processing ends, and the processing returns to FIG. 13.

<Flow of Resampling Processing>

Figure 16:
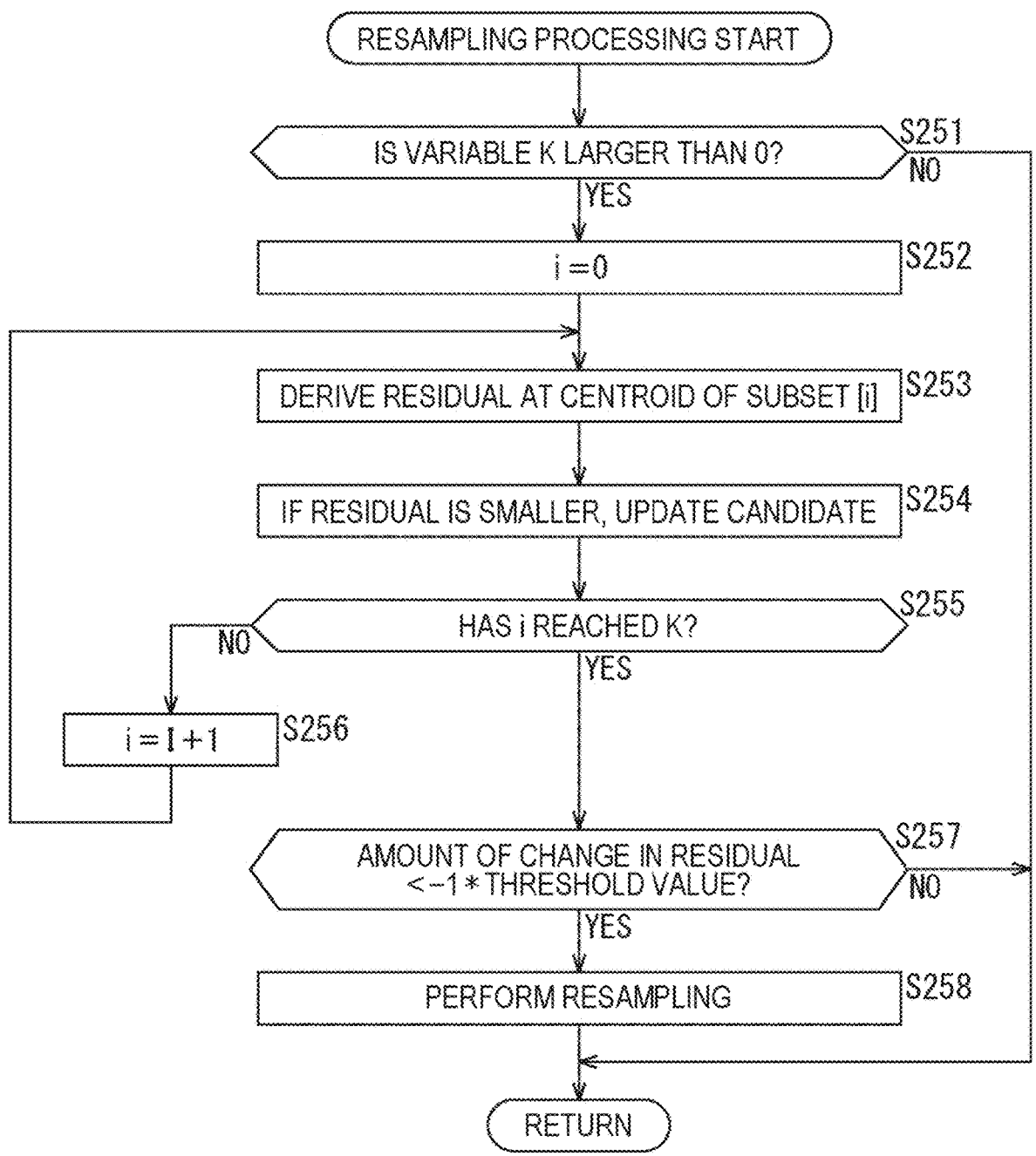
FIG. 16 is a flowchart describing an example of a flow of resampling processing.

Next, an example of a flow of resampling processing executed in Step S206 in FIG. 13 will be described with reference to the flowchart in FIG. 16.

When the resampling processing starts, the resampling unit 204 determines whether or not a variable K is larger than 0 in Step S251. When it is determined that the variable K is greater than 0, that is, when it is determined that there is a subset for the current node, the processing proceeds to Step S22.

In Step S252, the resampling unit 204 initializes a variable i (for example, i=0). The variable i is a variable for identifying a subset.

In Step S253, the resampling unit 204 uses a centroid of a subset [i] (i-th processed subset) as a predicted value, and derives a predictive residual.

In Step S254, when the predictive residual derived in Step S253 is smaller than a predictive residual of a held candidate, the resampling unit 204 updates the candidate to the predictive residual derived in Step S253. That is, the held candidate is discarded, and the predictive residual derived in Step S253 is held as a new candidate. When no candidate is held, the predictive residual derived in Step S253 is held as a candidate.

In Step S255, the resampling unit 204 determines whether or not the variable i has reached K. When it is determined that the variable i has not reached K, that is, when it is determined that there is an unprocessed subset, the processing proceeds to Step S256.

In Step S256, the resampling unit 204 increments the variable i by (+1). When the processing in Step S256 ends, the processing returns to Step S253. That is, the processing in Steps S253 to S256 is repeatedly executed until the variable i reaches K. Then, when it is determined in Step S255 that the variable i has reached K, that is, when it is determined that all the subsets have been processed, the processing proceeds to Step S257.

In Step S257, the resampling unit 204 determines whether or not (an absolute value of) an amount of change in the predictive residual held as the candidate from the predictive residual before the resampling is performed is smaller than a predetermined threshold value. When it is determined that the amount of change is smaller than the threshold value, the processing proceeds to Step S258.

That is, in this case, an error caused by the resampling is smaller than a maximum allowable error. Therefore, in Step S258, the resampling unit 204 performs the resampling to integrate point groups of the candidate subsets. Furthermore, the resampling unit 204 forms a reference structure for a point newly generated by the integration. When the processing in Step S258 ends, the resampling processing ends, and the processing returns to FIG. 13.

Furthermore, when it is determined in Step S257 that (the absolute value of) the amount of change from the predictive residual before the resampling is equal to or greater than the predetermined threshold value, an error caused by the resampling is equal to or greater than the maximum allowable error, and therefore the processing Step S258 is omitted (that is, the resampling is not performed), the resampling processing ends, and the processing returns to FIG. 13.

Moreover, when it is determined in Step S251 that the variable K is 0, that is, when it is determined that there is no subset for the current node, the processing in Steps S252 to S258 is omitted, the resampling processing ends, and the processing returns to FIG. 13.

By executing each processing as described above, the correction unit 112 can perform resampling as correction of geometry data. Furthermore, the correction unit 112 can perform resampling according to the reference structure. Moreover, the correction unit 112 can perform resampling within an allowable error. Furthermore, the correction unit 112 can define attribute data for a point obtained as a result of the resampling. Therefore, in <Resampling>, the correction unit 112 can obtain an above-described effect. Therefore, a coding apparatus 100 can reduce a decrease in flexibility in controlling an amount of coding the point cloud data.

4. Third Embodiment

<Refinement>

As described in the eighth row from the top of the table illustrated in FIG. 5, refinement of a point (movement of a point) may be performed as correction of geometry data (Method 1-4). For example, a prediction error may be reduced to reduce a coding amount by moving the point.

Figure 17B:
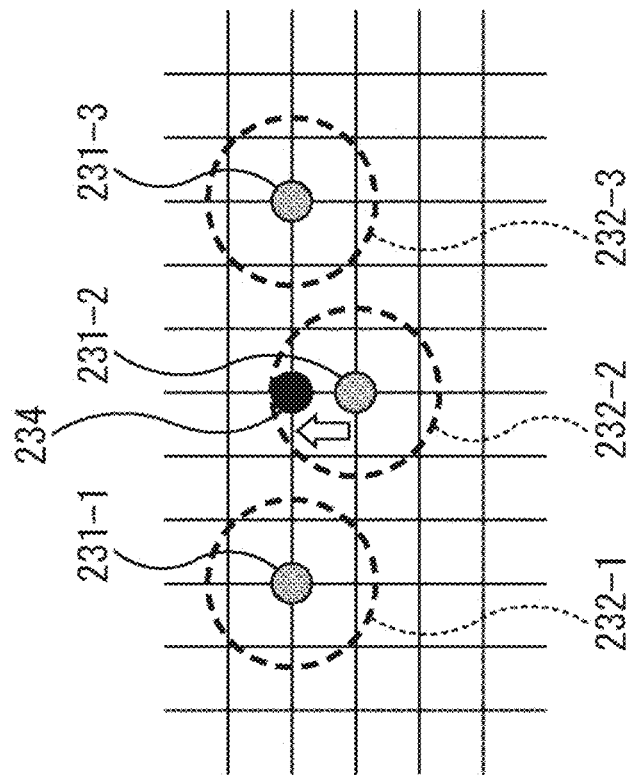
FIGS. 17A and 17B are diagrams describing refinement.
Figure 17A:
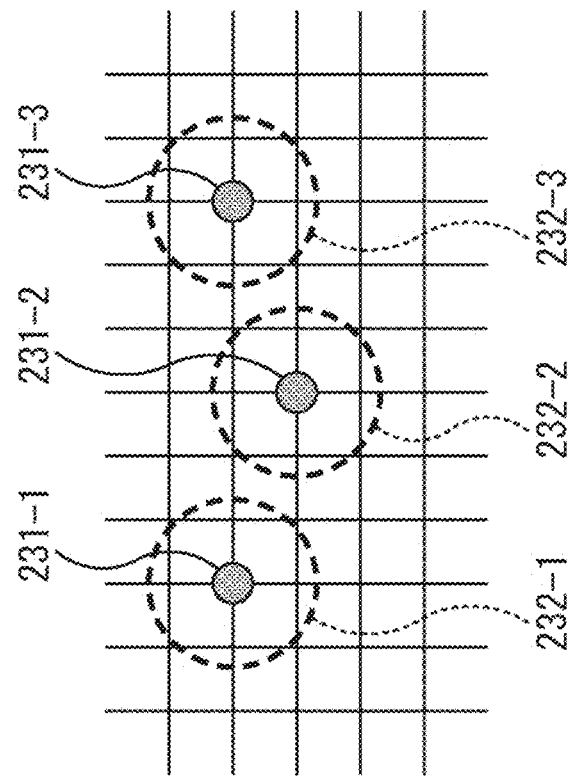

For example, as illustrated in FIG. 17A, it is assumed that there are points 231-1 to 231-3 in such a positional relation. Furthermore, in a predictive geometry coding, the point 231-1 is assumed to be a parent node of the point 231-2, and the point 231-2 is assumed to be a parent node of the point 231-2. In this case, as illustrated in FIG. 17B, by moving the point 231-2 onto a straight line connecting the point 231-1 and the point 231-3, predictive residuals of the points 231-2 and 231-3 can be reduced.

By applying such refinement, the coding amount can be reduced in units of points, and thus, the coding amount can be controlled more finely than in a case of quantization. For example, by controlling how many points are refined, how much the coding amount is reduced can be controlled. That is, it is possible to reduce a decrease in flexibility in controlling an amount of coding point cloud data.

In addition, the coding amount can be controlled more locally. Furthermore, a grid width of point positions can be maintained (geometry data can be corrected without increasing the grid width), and thus, the geometry data can be corrected with finer accuracy. Therefore, it is possible to reduce occurrence of unnecessary errors and a decrease in the number of points. Therefore, it is possible to reduce an increase in the coding amount while reducing deterioration in quality of the point cloud data.

As described in the ninth row from the top of the table illustrated in FIG. 5, refinement of such points may be performed according to a reference structure of coding using the predictive residual (Method 1-4-1). That is, the refinement may be performed along the reference structure used for deriving a predicted value.

Figure 18:
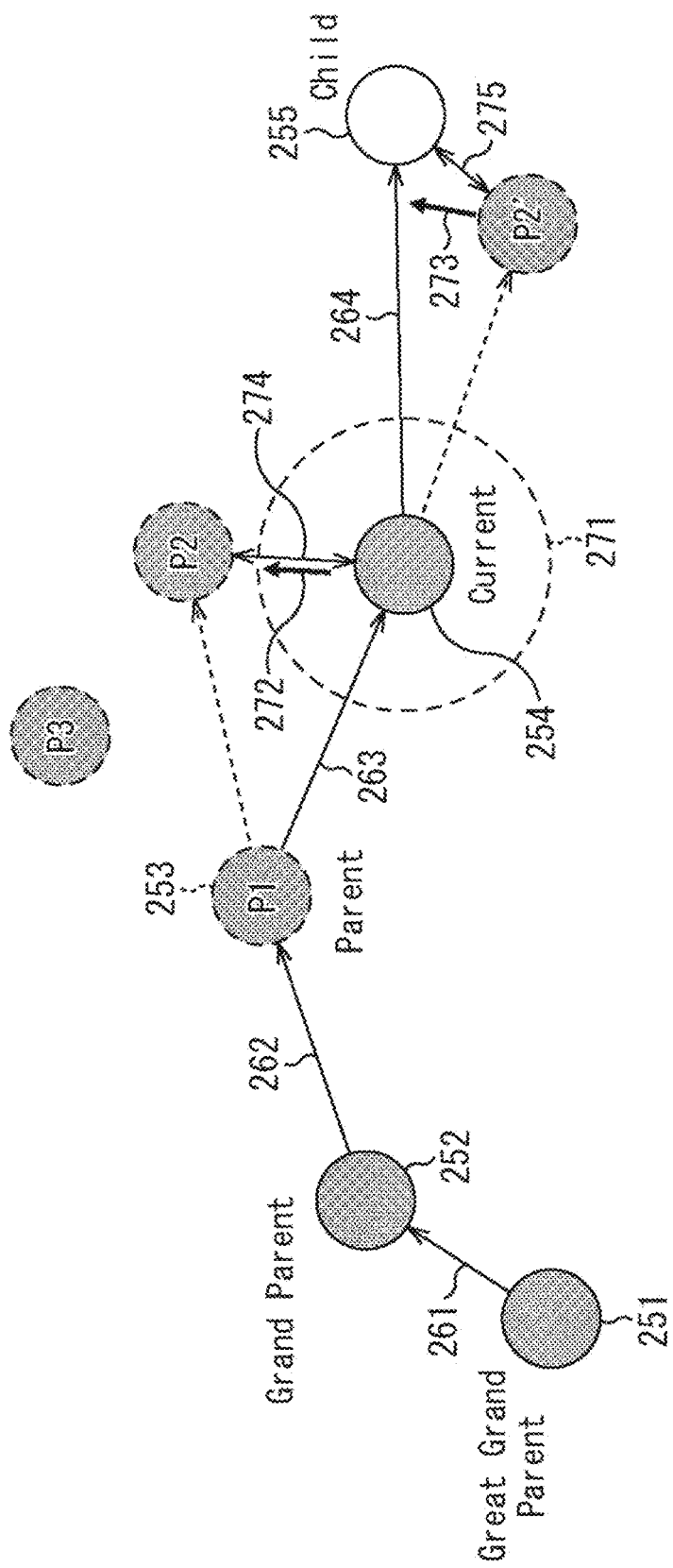
FIG. 18 is a diagram describing the refinement.

For example, as illustrated in FIG. 18, it is assumed that there are points 251 to 255, and that reference structures are formed as indicated by arrows 261 to 264. Refinement of each point may be performed according to such a reference structure.

For example, a current node in the reference structure may be refined so as to reduce a predictive residual of the current node. For example, in FIG. 18, when a point 254 is set as the current node, predicted values (P1 to P3) of the current node are derived by using a parent node 253 of the point 254. Because a predicted value P2 is closest to the point 254 in this case, the predicted value P2 is adopted. Therefore, the refinement is performed so that a predictive residual between geometry data of the point 254 and the predicted value P2 becomes smaller (so that the double-headed arrow 274 becomes shorter). That is, the point 254 is moved so as to approach the predicted value P2 (in a direction of the arrow 272). By performing the refinement in this manner, the predictive residual of the current node can be reduced.

Furthermore, the refinement may be performed so as to reduce a sum of the predictive residual of the current node in the reference structure and a predictive residual of a child node of the current node. For example, in FIG. 18, when the current node is refined, a predicted value (predictive residual) of the point 255, which is a child node of the current node, may also change. For example, when the point 254 is moved in a direction of the arrow 272, a predicted value P2' of the point 254 derived by using the point 255 also moves in a direction of the arrow 273. Therefore, the refinement is performed so that a sum of a predictive residual between the geometry data of the point 254 and the predicted value P2, and a predictive residual between geometry data of the point 255 and the predicted value P2' becomes smaller (so that a sum of a length of the double-headed arrow 274 and a length of the double-headed arrow 275 becomes shorter). By performing the refinement in this manner, it is possible to reduce the predictive residual of the current node while reducing an increase in the predictive residual of the child node.

Note that all or some of the points may be such refinement targets. When refinement is performed a plurality of times while changing a target point, the target may be changed in an order from a parent node to a child node in the reference structure. Because refinement of a parent node as described above also affects a predictive residual of a child node, derivation of a predictive residual (selection of a prediction mode) is easier if the refinement is performed in such order.

As described in the tenth row from the top of the table illustrated in FIG. 5, refinement of such points may be performed within an allowable error (Method 1-4-2). That is, an allowable error (threshold values) indicating a range of allowable error may be provided, and the refinement (movement of the point) may be limited within the allowable error.

For example, a maximum allowable error is Th. Because a magnitude of an error can be indicated by a distance from a point before correction, in a case of an example in FIG. 17A, allowable error ranges of the points 231-1 to 231-3 are indicated by dotted circles each having a radius Th centered on each of the points, as ranges 232-1 to 232-3. That is, each point can be moved within a range of a dotted circle. That is, as illustrated in FIG. 17B, a position of a point 234 obtained by refining the point 231-2 is limited within a range 232-2.

A similar applies to a case of FIG. 18. An allowable error range of the point 254 as the current node is indicated by a dotted circle having a radius Th centered on the point 254, as a range 271. Movement of the point 254 by refinement is limited within the range 271.

Thus, by limiting a range within which a point can be moved, a maximum error can be guaranteed. With this arrangement, unnecessary deterioration in quality of the point cloud data can be reduced.

Note that refinement may be performed only when the coding amount is reduced to a predetermined threshold value or more by the refinement. In other words, refinement may not be performed for a point for which an amount (or degree) of reducing the coding amount is (or is expected to be) smaller than a threshold value thereof even of the refinement is performed. With this arrangement, refinement can be performed only for a point for which a sufficient effect can be (or is expected to be) obtained (refinement with which a sufficient effect cannot be (or is expected not to be) obtained can be omitted), and thus it is possible to reduce an increase in load.

As described in the eleventh row from the top of the table illustrated in FIG. 5, re-color processing for updating the attribute data may be performed for the points after the refinement (Method 1-4-3). As described above, because the point to be processed moves by the refinement, the attribute data may be updated by the re-color processing so as to have a value more suitable for the position. With this arrangement, attribute data that is more accurate (more suitable for the geometry data) can be coded. With this arrangement, unnecessary deterioration in quality of the point cloud data can be reduced.

<Correction Unit>

Figure 19:
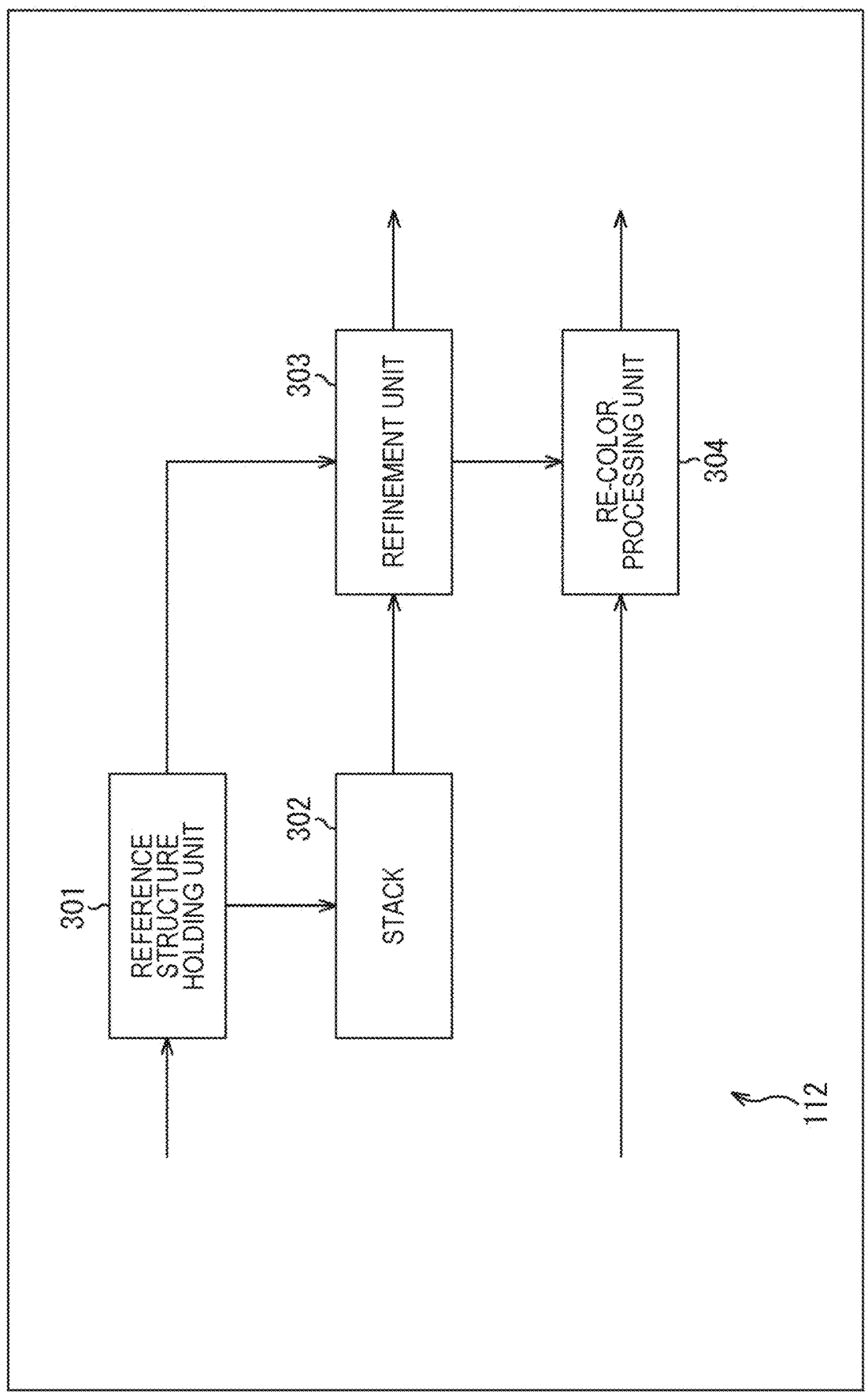
FIG. 19 is a block diagram illustrating a main configuration example of a correction unit.

FIG. 19 is a block diagram illustrating a main configuration example of a correction unit 112 in this case. Note that FIG. 19 illustrates a main configuration including processing units, data flows, and the like, and the processing units and data flows illustrated in FIG. 19 are not necessarily all. That is, in the correction unit 112, there may be a processing unit not illustrated as a block in FIG. 19, or there may be processing or data flow not illustrated as an arrow, or the like, in FIG. 19.

As illustrated in FIG. 19, the correction unit 112 of a geometry data coding unit 101 includes a reference structure holding unit 301, a stack 302, a refinement unit 303, and a re-color processing unit 304.

Similarly to the reference structure holding unit 201, the reference structure holding unit 301 performs processing related to holding of the reference structure. For example, the reference structure holding unit 301 acquires and stores geometry data and information indicating the reference structure that are supplied from a reference structure formation unit 111. The reference structure holding unit 301 supplies the stack 302 with the geometry data of each point according to the reference structure, and causes the stack 302 to store the geometry data. Furthermore, according to the reference structure, the reference structure holding unit 301 supplies the refinement unit 303 with information (geometry data) of nodes, the information being necessary for processing.

Similarly to the stack 302, the stack 302 holds information in a last-in, first-out manner. For example, the stack 302 holds the geometry data of each point, the geometry data being supplied from the reference structure holding unit 301. Furthermore, in response to a request from the refinement unit 303, the stack 302 supplies the refinement unit 303 with last held information (geometry data) among the information held.

The refinement unit 303 performs processing related to refinement. For example, from the stack 302, the refinement unit 303 reads geometry data of the point to be processed (current node). Furthermore, from the reference structure holding unit 301, the refinement unit 303 acquires geometry data of nodes that may be refinement targets other than the current node. The refinement unit 303 performs refinement of the current node by using information of those nodes. The refinement unit 303 supplies a refinement result to a predictive residual derivation unit 113. Furthermore, the refinement unit 303 also supplies the refinement result to the re-color processing unit 304. The refinement unit 303 repeats the above-described processing until the stack 202 becomes empty or a predetermined number of points are processed.

The re-color processing unit 304 performs processing related to re-color processing. For example, from the refinement unit 303, the re-color processing unit 304 acquires the refinement result, that is, the geometry data of a point after movement. Furthermore, the re-color processing unit 304 acquires the attribute data supplied from the reference structure formation unit 111. The re-color processing unit 304 updates attribute data of the point according to a position after the movement. A method for the re-color processing is arbitrary. For example, by using attribute data of a point positioned around the point (for example, with a weighted average according to a distance, or the like), the re-color processing unit 304 updates attribute data of the point. The re-color processing unit 304 performs the re-color processing in this manner for all refinement results (points after movement) supplied from the refinement unit 303. The re-color processing unit 304 supplies the predictive residual derivation unit 113 with the attribute data updated as described above.

Note that these processing units (the reference structure holding unit 301 to the re-color processing unit 304) have any configuration. For example, each of the processing units may include a logic circuit that achieves the above-described processing. Furthermore, each of the processing units may have, for example, a CPU, a ROM, a RAM, and the like, and execute a program by using the CPU, the ROM, the RAM, and the like to achieve the above-described processing. Needless to say, each of the processing units may have both the configurations and part of the above-described processing may be achieved by the logic circuit, and another may be achieved by executing the program. Configurations of the processing units may be independent from each other, and, for example, among the processing units, some processing units may achieve part of the above-described processing with a logic circuit, some other processing units may achieve the above-described processing by executing a program, and still some other processing units may achieve the above-described processing with both a logic circuit and execution of a program.

With such a configuration, the correction unit 112 can perform refinement as correction of the geometry data. Furthermore, the correction unit 112 can perform refinement according to the reference structure. Moreover, the correction unit 112 can perform refinement within an allowable error. Furthermore, the correction unit 112 can perform re-color processing on a point moved by the refinement. Therefore, in <Refinement>, the correction unit 112 can obtain an above-described effect. Therefore, a coding apparatus 100 can reduce a decrease in flexibility in controlling an amount of coding the point cloud data.

<Flow of Correction Processing>

Next, an example of a flow of correction processing executed by the correction unit 112 in this case in Step S112 in FIG. 8 will be described with reference to the flowchart in FIG. 20.

When the correction processing starts, in Step S301, the reference structure holding unit 301 acquires and stores geometry data and information indicating the reference structure that are supplied from the reference structure formation unit 111. Then, the reference structure holding unit 301 supplies the stack 302 with geometry data of a head node of the reference structure. The stack 302 holds the geometry data.

In Step S302, the refinement unit 303 initializes (for example, 0) a value of a variable cnt. In this case, the correction unit 112 has preset the number of nodes Num to be refined. That is, the correction unit 112 refines up to Num of nodes. If a value of Num is set to a value larger than the number of points of the point cloud data (the number of nodes of the reference structure), the correction unit 112 performs refinement for all the points of the point cloud data. The variable cnt is a variable for counting the number of refined nodes for such control.

In Step S303, the refinement unit 303 reads, from the stack 302, the geometry data of a node last held by the stack 302. The refinement unit 303 sets the node as the current node.

In Step S304, the refinement unit 303 increments the value of the variable cnt by (+1). That is, the current node is counted as processed.

In Step S305, the refinement unit 303 refines the current node. For example, the refinement unit 303 applies a method described above in <Refinement> and performs the refinement so that the coding amount decreases.

In Step S306, the re-color processing unit 304 performs re-color processing on the refined point and updates attribute data thereof.

In Step S307, the reference structure holding unit 301 supplies the stack 302 with geometry data of the child node of the current node. The stack 302 holds the geometry data.

In Step S308, the refinement unit 303 determines whether or not the stack 302 is empty or the variable cnt has reached Num. The stack 302 being empty means that all points of the point cloud data have been processed. Furthermore, the variable cnt having reached Num means that the number of refined nodes has reached an upper limit.

When it is determined that the geometry data is held in the stack 302 and that the variable cnt has not reached Num, that is, when it is determined that there is an unprocessed point and that the number of refined nodes has not reached the upper limit, the processing returns to Step S303, and the subsequent processing is repeated. That is, the processing in Steps S303 to S308 is repeatedly executed until it is determined that the stack 302 is empty or the variable cnt reaches Num.

When it is determined that the stack 302 is empty or that the variable cnt has reached Num, that is, when it is determined that all the points of the point cloud data have been processed, or that the number of refined nodes has reached the upper limit, the correction processing ends and the processing returns to FIG. 8.

By executing each processing as described above, the correction unit 112 can perform refinement as correction of geometry data. Furthermore, the correction unit 112 can perform refinement according to the reference structure. Moreover, the correction unit 112 can perform refinement within an allowable error. Furthermore, the correction unit 112 can perform re-color processing on a refined point. Therefore, in <Refinement>, the correction unit 112 can obtain an above-described effect. Therefore, a coding apparatus 100 can reduce a decrease in flexibility in controlling an amount of coding the point cloud data.

5. Fourth Embodiment

<Combination>

As described in the twelfth row from the top of the table (bottom row) illustrated in FIG. 5, quantization before coding, the above-described resampling, and the above-described refinement may be applied in combination (Method 1-5).

Figure 21A:
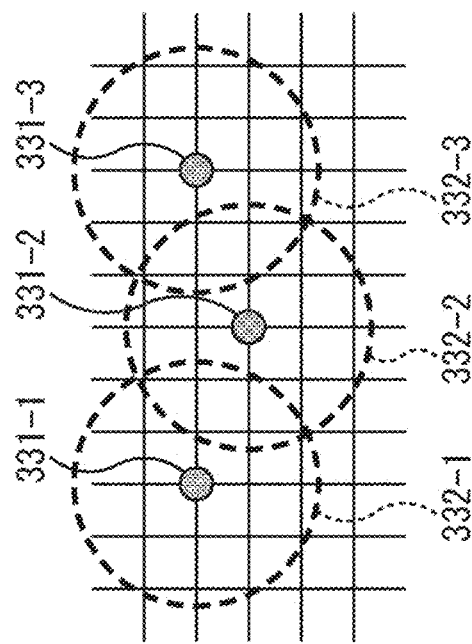
FIGS. 21A, 21B, and 21C are diagrams describing an example of a combination of quantization and refinement.
Figure 21B:
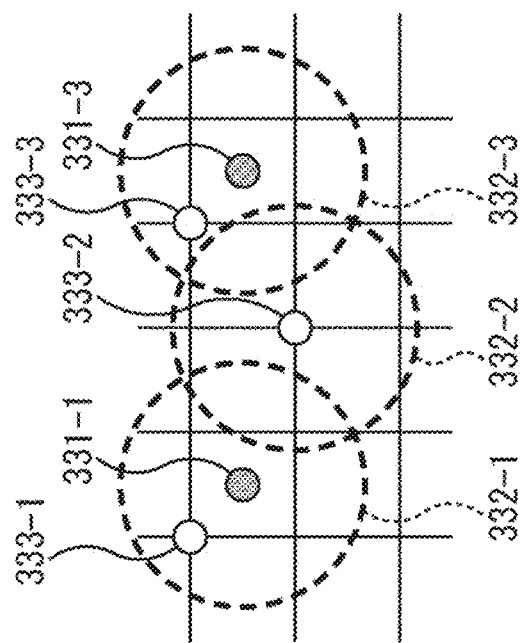
Figure 21C:
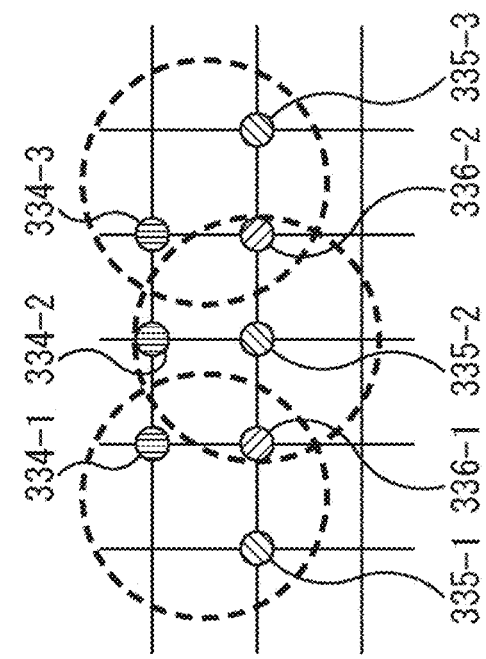

For example, as illustrated in FIG. 21A, it is assumed that there are points 331-1 to 331-3 in a positional relation as in the drawing, and maximum allowable errors thereof are set as ranges 332-1 to 332-3, respectively. In FIGS. 21A, 21B, and 21C, vertical and horizontal straight lines indicate grids on which points are positioned.

When quantization before coding is performed, as illustrated in FIG. 21B, a grid width increases, and the points 331-1 to 331-3 move to positions within the ranges 332-1 to 332-3 and on the grids, like points 333-1 to 333-3, respectively.

Moreover, by performing refinement as described above in the coding, as illustrated in FIG. 21C, the points 331-1 to 333-3 can be moved like points 334-1 to 334-3, or can be moved like points 335-1 to 335-3. Further resampling can be performed to achieve disposition at points 336-1 and 336-2.

Thus, by combining a plurality of methods, it is possible to increase the number of candidates of positions after point correction, as compared with a case of simply performing quantization as in FIG. 21B. Therefore, it is possible to reduce a decrease in flexibility in controlling an amount of coding point cloud data.

<4-1: Combination with Quantization>

<Coding Apparatus>

Figure 22:
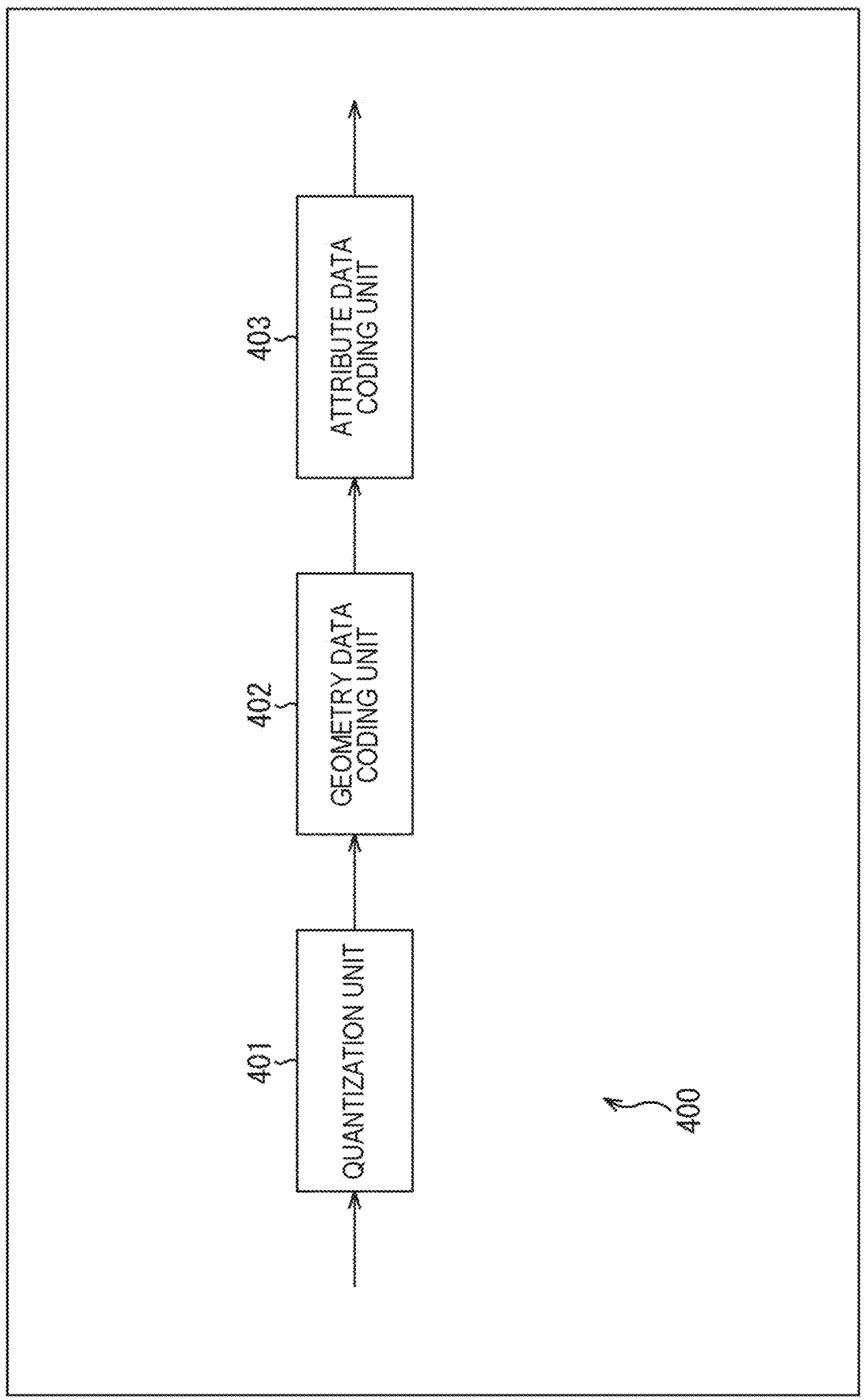
FIG. 22 is a block diagram illustrating a main configuration example of a coding apparatus.

FIG. 22 is a block diagram illustrating an example of a configuration of a coding apparatus that is an aspect of an information processing apparatus to which the present technology is applied. Similarly to the coding apparatus 100, a coding apparatus 400 illustrated in FIG. 22 is an apparatus that codes a point cloud (3D data). The coding apparatus 400 codes a point cloud by applying the present technology described above (for example, the method illustrated in FIG. 5, or the like). Furthermore, the coding apparatus 400 performs quantization before the coding. That is, the coding apparatus 400 applies quantization before the coding and the present technology in combination.

Note that FIG. 22 illustrates a main configuration including processing units, data flows, and the like, and the processing units and data flows illustrated in FIG. 22 are not necessarily all. That is, in the coding apparatus 400, there may be a processing unit not illustrated as a block in FIG. 22, or there may be processing or data flow not illustrated as an arrow, or the like, in FIG. 22.

As illustrated in FIG. 22, the coding apparatus 400 includes a quantization unit 401, a geometry data coding unit 402, and an attribute data coding unit 403.

The quantization unit 401 performs processing related to quantization of the geometry data. For example, the quantization unit 401 acquires the point cloud (3D data) input to the coding apparatus 400. The quantization unit 401 quantizes geometry data of the point cloud data in a predetermined quantization step to reduce an information amount. The quantization unit 401 supplies the geometry data coding unit 402 with the quantized geometry data, and attribute data.

Similarly to the geometry data coding unit 101, the geometry data coding unit 402 performs processing related to coding of geometry data. For example, the geometry data coding unit 402 acquires the quantized geometry data and the attribute data that are supplied from the quantization unit 401. The geometry data coding unit 402 codes the geometry data (position information) and generates coded data of the geometry data. At that time, by applying the above-described present technology, the geometry data coding unit 402 corrects the geometry data so that the coding amount decreases in coding using a predictive residual. That is, similarly to the geometry data coding unit 101, the geometry data coding unit 402 includes a reference structure formation unit 111 to a coding unit 114.

In the correction, the geometry data coding unit 402 may perform, for example, resampling as described in the second embodiment, or may perform refinement as described in the third embodiment. In a case of performing resampling, a correction unit 112 of the geometry data coding unit 402 includes a configuration as in an example in FIG. 12. Furthermore, in a case of performing refinement, the correction unit 112 of the geometry data coding unit 402 includes a configuration as in an example in FIG. 19.

Then, the geometry data coding unit 402 derives a predictive residual by using the corrected geometry data, and codes the predictive residual. Furthermore, the geometry data coding unit 402 supplies the attribute data coding unit 403 with the generated coded data of the geometry data and attribute data (attribute information).

Similarly to the attribute data coding unit 102, the attribute data coding unit 403 performs processing related to coding of attribute data. For example, the attribute data coding unit 403 acquires the coded data of the geometry data and the attribute data that are supplied from the geometry data coding unit 402. The attribute data coding unit 403 codes the attribute data by using them and generates coded data of the attribute data. The attribute data coding unit 403 outputs, to outside of the coding apparatus 400 (to a decoding side, for example), the coded data of the geometry data and the generated coded data of the attribute data, as coded data of the point cloud data.

Note that these processing units (the quantization unit 401 to the attribute data coding unit 403) have any configuration. For example, each of the processing units may include a logic circuit that achieves the above-described processing. Furthermore, each of the processing units may have, for example, a CPU, a ROM, a RAM, and the like, and execute a program by using the CPU, the ROM, the RAM, and the like to achieve the above-described processing. Needless to say, each of the processing units may have both the configurations and part of the above-described processing may be achieved by the logic circuit, and another may be achieved by executing the program. Configurations of the processing units may be independent from each other, and, for example, among the processing units, some processing units may achieve part of the above-described processing with a logic circuit, some other processing units may achieve the above-described processing by executing a program, and still some other processing units may achieve the above-described processing with both a logic circuit and execution of a program.

With the above configuration, the coding apparatus 400 can further control the coding amount by performing the quantization before the coding. Therefore, the coding apparatus 400 can further reduce a decrease in flexibility in controlling an amount of coding the point cloud data.

<Flow of Coding Processing>

Figure 23:
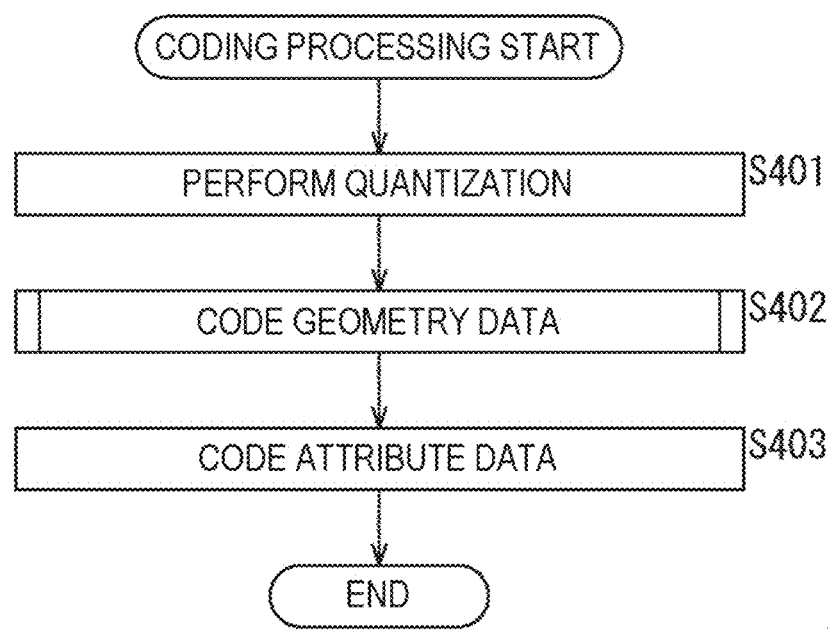
FIG. 23 is a flowchart describing an example of a flow of coding processing.

Next, an example of a flow of coding processing executed by the coding apparatus 400 will be described with reference to a flowchart in FIG. 23.

When the coding processing starts, in Step S401, the quantization unit 401 of the coding apparatus 400 performs quantization processing to quantize the geometry data.

In Step S402, the geometry data coding unit 402 executes geometry data coding processing, thereby coding geometry data of the input point cloud to generate coded data of the geometry data. The geometry data coding processing may be performed by a flow similar to the flow in an example in FIG. 8. Furthermore, correction processing (Step S122) in that case may be performed in a flow similar to the flow in an example in FIG. 13 (resampling may be performed), or in a flow similar to the flow in an example in FIG. 20 (refinement may be performed).

In Step S403, the attribute data coding unit 403 codes attribute data of the input point cloud to generate coded data of the attribute data.

When the processing in Step S403 ends, the coding processing ends.

By executing each processing as described above, the coding apparatus 400 can further control the coding amount by performing the quantization before the coding. Therefore, the coding apparatus 400 can further reduce a decrease in flexibility in controlling an amount of coding the point cloud data.

<4-2: Combination of Refinement and Resampling>
<Correction Unit>

Both the resampling described in the second embodiment and the refinement described in the third embodiment may be applied.

For example, the geometry data may be refined, and the refined geometry data may be resampled.

Figure 24:
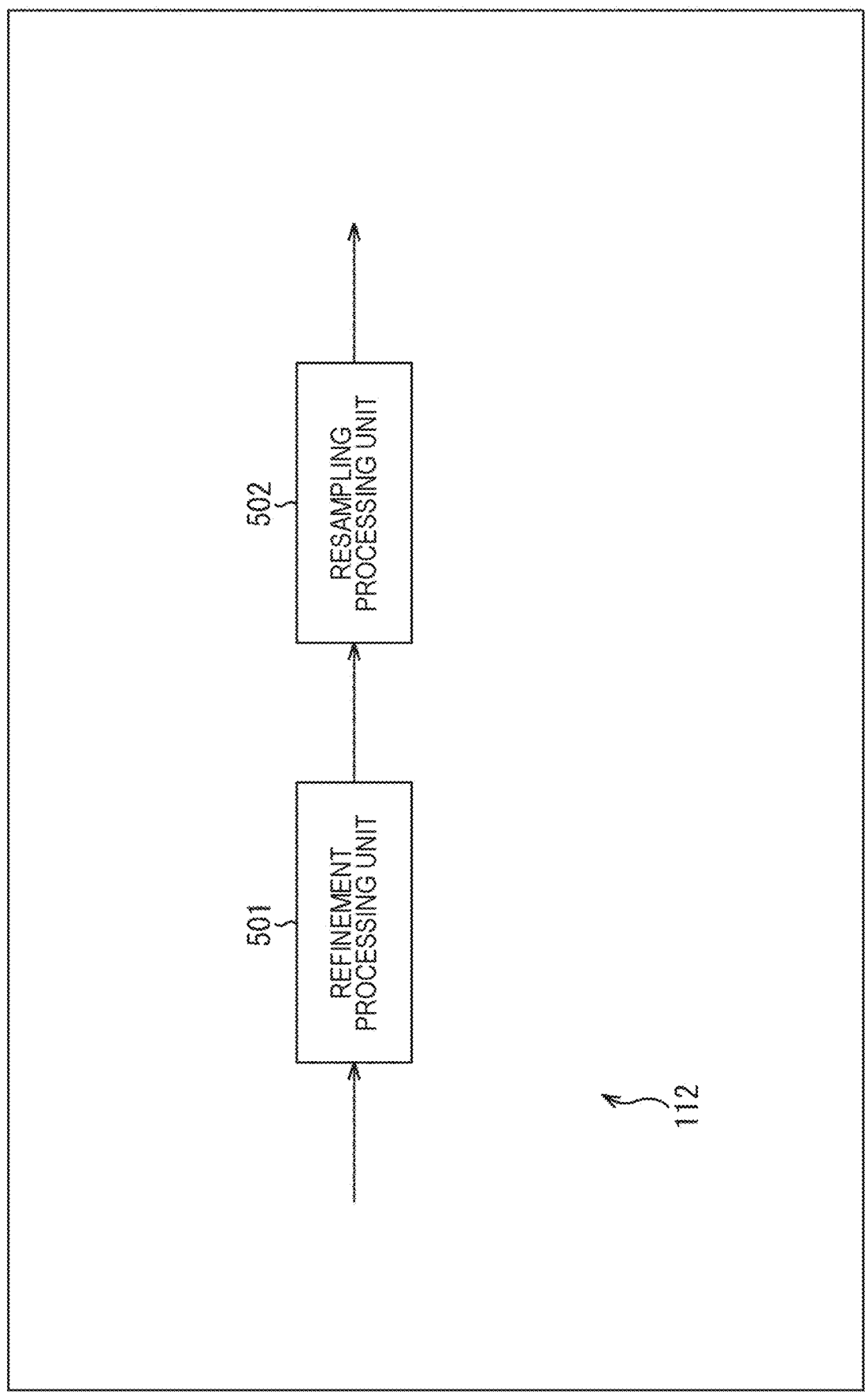
FIG. 24 is a block diagram illustrating a main configuration example of a correction unit.

FIG. 24 is a block diagram illustrating a main configuration example of the correction unit 112 in this case. Note that FIG. 24 illustrates a main configuration including processing units, data flows, and the like, and the processing units and data flows illustrated in FIG. 24 are not necessarily all. That is, in the correction unit 112, there may be a processing unit not illustrated as a block in FIG. 24, or there may be processing or data flow not illustrated as an arrow, or the like, in FIG. 24.

As illustrated in FIG. 24, the correction unit 112 in this case includes a refinement processing unit 501 and a resampling processing unit 502.

The refinement processing unit 501 corrects the geometry data by performing refinement on the geometry data. That is, the refinement processing unit 501 corrects the geometry data by the method described in the third embodiment. That is, the refinement processing unit 501 includes a configuration similar to the configuration of the correction unit 112 in FIG. 19 (a reference structure holding unit 301 to a re-color processing unit 304), and performs similar processing.

The refinement processing unit 501 supplies the resampling processing unit 502 with the refined geometry data and attribute data.

The resampling processing unit 502 corrects the refined geometry data by performing resampling on the geometry data. That is, the resampling processing unit 502 corrects the geometry data by the method described in the second embodiment. That is, the resampling processing unit 502 includes a configuration similar to the configuration of the correction unit 112 in FIG. 12 (a reference structure holding unit 201 to an attribute definition unit 205), and performs similar processing.

The resampling processing unit 502 supplies a predictive residual derivation unit 113 with the resampled geometry data and attribute data.

Note that these processing units (the refinement processing unit 501 and the resampling processing unit 502) have any configuration. For example, each of the processing units may include a logic circuit that achieves the above-described processing. Furthermore, each of the processing units may have, for example, a CPU, a ROM, a RAM, and the like, and execute a program by using the CPU, the ROM, the RAM, and the like to achieve the above-described processing. Needless to say, each of the processing units may have both the configurations and part of the above-described processing may be achieved by the logic circuit, and another may be achieved by executing the program. Configurations of the processing units may be independent from each other, and, for example, among the processing units, some processing units may achieve part of the above-described processing with a logic circuit, some other processing units may achieve the above-described processing by executing a program, and still some other processing units may achieve the above-described processing with both a logic circuit and execution of a program.

With such a configuration, the correction unit 112 can perform refinement and resampling as correction of the geometry data. Furthermore, the correction unit 112 can perform refinement and resampling according to the reference structure. Moreover, the correction unit 112 can perform refinement and resampling within an allowable error. Furthermore, the correction unit 112 can perform re-color processing on a point moved by the refinement. Moreover, the correction unit 112 can define attribute data for a point obtained as a result of the resampling. Thus, the correction unit 112 can correct geometry data by more various methods. Therefore, the coding apparatus 100 can further reduce a decrease in flexibility in controlling an amount of coding the point cloud data.

<Flow of Correction Processing>

Figure 25:
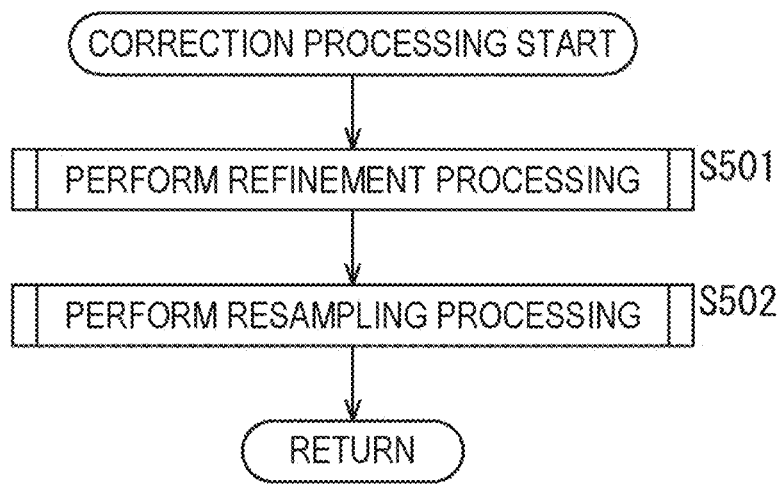
FIG. 25 is a flowchart describing an example of a flow of correction processing.

Next, an example of a flow of correction processing executed by the correction unit 112 in this case in Step S112 in FIG. 8 will be described with reference to the flowchart in FIG. 25.

When the correction processing starts in Step S501, the refinement processing unit 501 executes refinement processing and correct the geometry data by applying the refinement. That is, the refinement processing unit 501 executes the refinement processing in a flow similar to the flow of the correction processing in FIG. 20.

In Step S502, the resampling processing unit 502 executes resampling processing and correct the geometry data by applying the resampling. That is, the resampling processing unit 502 executes the resampling processing in a flow similar to the flow of the correction processing in FIG. 13.

When the processing in Step S502 ends, the correction processing ends, and the processing returns to FIG. 8.

By executing each processing as described above, the correction unit 112 can perform refinement and resampling as correction of geometry data. That is, the correction unit 112 can correct geometry data by more various methods. Therefore, the coding apparatus 100 can further reduce a decrease in flexibility in controlling an amount of coding the point cloud data.

<Combination with Quantization>

Note that there may be a combination with quantization processing before the coding. In this case, it is only required to apply the configuration example in FIG. 24 as the configuration of the correction unit 112 of the geometry data coding unit 402 of the coding apparatus 400 in FIG. 22. Furthermore, it is only required to apply the geometry data coding processing in FIG. 8 as the geometry data coding processing executed in Step S402 in FIG. 23, and further, to apply the correction processing in FIG. 25 as the correction processing executed in Step S122.

With this arrangement, the correction unit 112 can correct the geometry data with more various methods, and thus, the coding apparatus 400 can reduce a decrease in flexibility in controlling the amount of coding the point cloud data.

<4-3: Combination of Resampling and Refinement>
<Correction Unit>

For example, the geometry data may be resampled, and the resampled geometry data may be refined.

Figure 26:
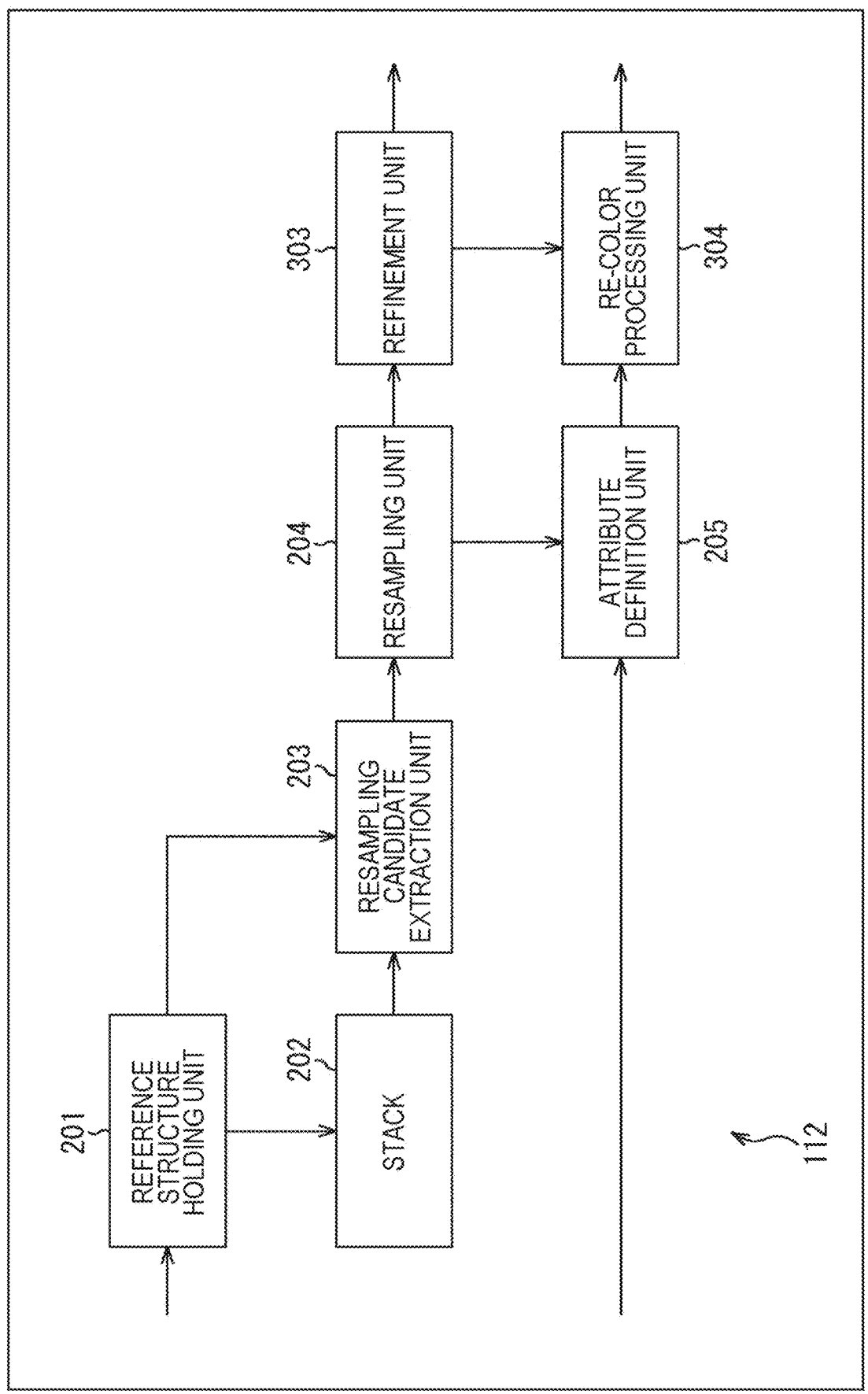
FIG. 26 is a block diagram illustrating a main configuration example of a correction unit.

FIG. 26 is a block diagram illustrating a main configuration example of the correction unit 112 in this case. Note that FIG. 26 illustrates a main configuration including processing units, data flows, and the like, and the processing units and data flows illustrated in FIG. 26 are not necessarily all. That is, in the correction unit 112, there may be a processing unit not illustrated as a block in FIG. 26, or there may be processing or data flow not illustrated as an arrow, or the like, in FIG. 26.

As illustrated in FIG. 26, the correction unit 112 in this case includes the reference structure holding unit 201 to the attribute definition unit 205, a refinement unit 303, and the re-color processing unit 304.

The reference structure holding unit 201 to the attribute definition unit 205 basically perform processing similar to the processing in a case of an example in FIG. 12. In this regard, however, the resampling unit 204 supplies a resampling result to the attribute definition unit 205 and the refinement unit 303. Furthermore, the attribute definition unit 205 supplies updated attribute data to the re-color processing unit 304.

The refinement unit 303 and the re-color processing unit 304 basically perform processing similar to the processing in a case of an example in FIG. 19. In this regard, however, the refinement unit 303 acquires the resampling result supplied from the resampling unit 204, and refines the resampled geometry data. The refinement unit 303 supplies a refinement result to the predictive residual derivation unit 113 and the re-color processing unit 304.

The re-color processing unit 304 acquires the updated attribute data supplied from the attribute definition unit 205 and performs re-color processing by using the attribute data. The re-color processing unit 304 supplies the predictive residual derivation unit 113 with the attribute data updated.

Note that these processing units (the reference structure holding unit 201 to the attribute definition unit 205, the refinement unit 303, and the re-color processing unit 304) have any configuration. For example, each of the processing units may include a logic circuit that achieves the above-described processing. Furthermore, each of the processing units may have, for example, a CPU, a ROM, a RAM, and the like, and execute a program by using the CPU, the ROM, the RAM, and the like to achieve the above-described processing. Needless to say, each of the processing units may have both the configurations and part of the above-described processing may be achieved by the logic circuit, and another may be achieved by executing the program. Configurations of the processing units may be independent from each other, and, for example, among the processing units, some processing units may achieve part of the above-described processing with a logic circuit, some other processing units may achieve the above-described processing by executing a program, and still some other processing units may achieve the above-described processing with both a logic circuit and execution of a program.

With such a configuration, the correction unit 112 can perform resampling and refinement as correction of the geometry data. Furthermore, the correction unit 112 can perform resampling and refinement according to the reference structure. Moreover, the correction unit 112 can perform resampling and refinement within an allowable error. Furthermore, the correction unit 112 can define attribute data for a point obtained as a result of the resampling. Moreover, the correction unit 112 can perform re-color processing on a point moved by the refinement. Thus, the correction unit 112 can correct geometry data by more various methods. Therefore, the coding apparatus 100 can further reduce a decrease in flexibility in controlling an amount of coding the point cloud data.

<Flow of Correction Processing>

Figure 27:
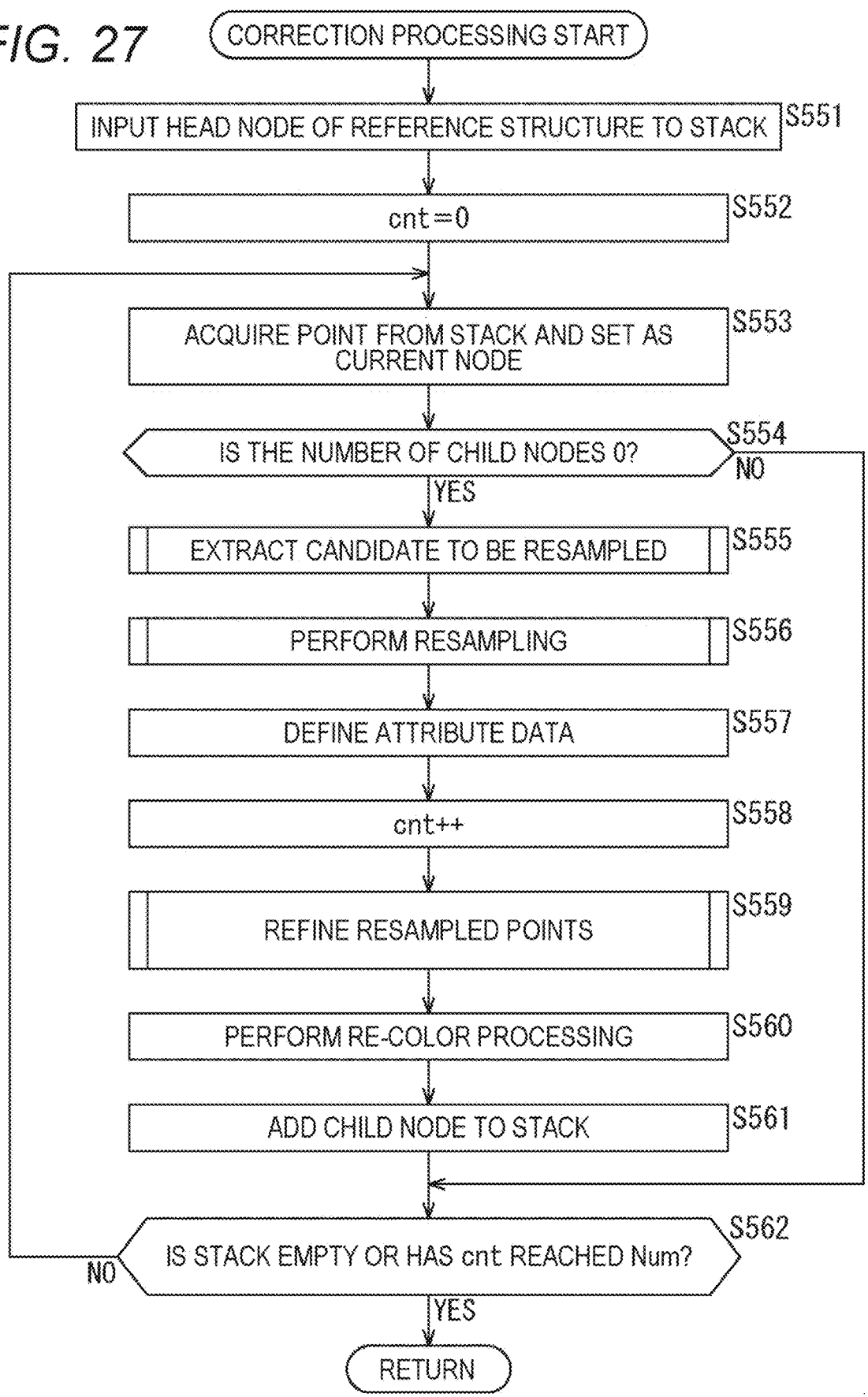
FIG. 27 is a flowchart describing an example of a flow of correction processing.

Next, an example of a flow of correction processing executed by the correction unit 112 in this case in Step S112 in FIG. 8 will be described with reference to the flowchart in FIG. 27.

When the correction processing starts, each processing in Steps S551 to S557 is executed similarly to each processing in Steps S201 to S207 in FIG. 13. Furthermore, the processing in Step S558 is executed similarly to the processing in Step S209 in FIG. 13.

Figure 20:
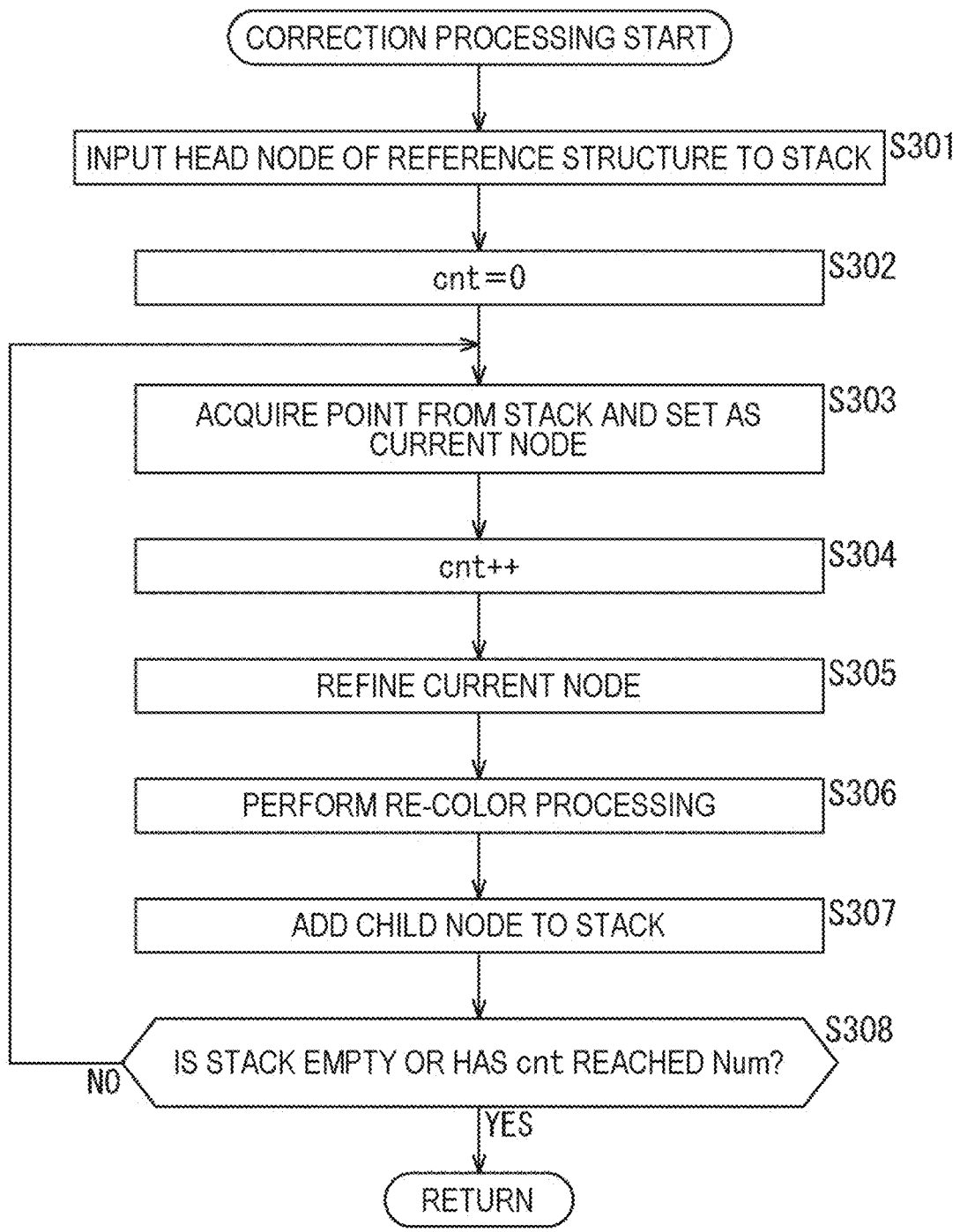
FIG. 20 is a flowchart describing an example of a flow of correction processing.

In Step S559, the refinement unit 303 performs processing similar to the processing in Step S305 in FIG. 20 to refine resampled points.

In Step S560, the re-color processing unit 304 performs processing similar to the processing in Step S306 in FIG. 20, and performs the re-color processing on the refined points.

Each processing in Steps S561 and S562 is executed similarly to each processing in Steps S210 and S211 in FIG. 13.

When the processing in Step S562 ends, the correction processing ends, and the processing returns to FIG. 8.

By executing each processing as described above, the correction unit 112 can perform resampling and refinement as correction of geometry data. That is, the correction unit 112 can correct geometry data by more various methods. Therefore, the coding apparatus 100 can further reduce a decrease in flexibility in controlling an amount of coding the point cloud data.

<Combination with Quantization>

Note that there may be a combination with quantization processing before the coding. In this case, it is only required to apply the configuration example in FIG. 26 as the configuration of the correction unit 112 of the geometry data coding unit 402 of the coding apparatus 400 in FIG. 22. Furthermore, it is only required to apply the geometry data coding processing in FIG. 8 as the geometry data coding processing executed in Step S402 in FIG. 23, and further, to apply the correction processing in FIG. 27 as the correction processing executed in Step S122.

With this arrangement, the correction unit 112 can correct the geometry data with more various methods, and thus, the coding apparatus 400 can reduce a decrease in flexibility in controlling the amount of coding the point cloud data.

6. Supplementary Note

<Computer>

The above-described series of processing can be executed by hardware or can be executed by software. When a series of processing is executed by software, a program included in the software is installed on a computer. Here, examples of the computer include a computer incorporated in dedicated hardware, a general-purpose personal computer, for example, which is capable of executing various kinds of functions by installing various kinds of programs, or the like.

Figure 28:
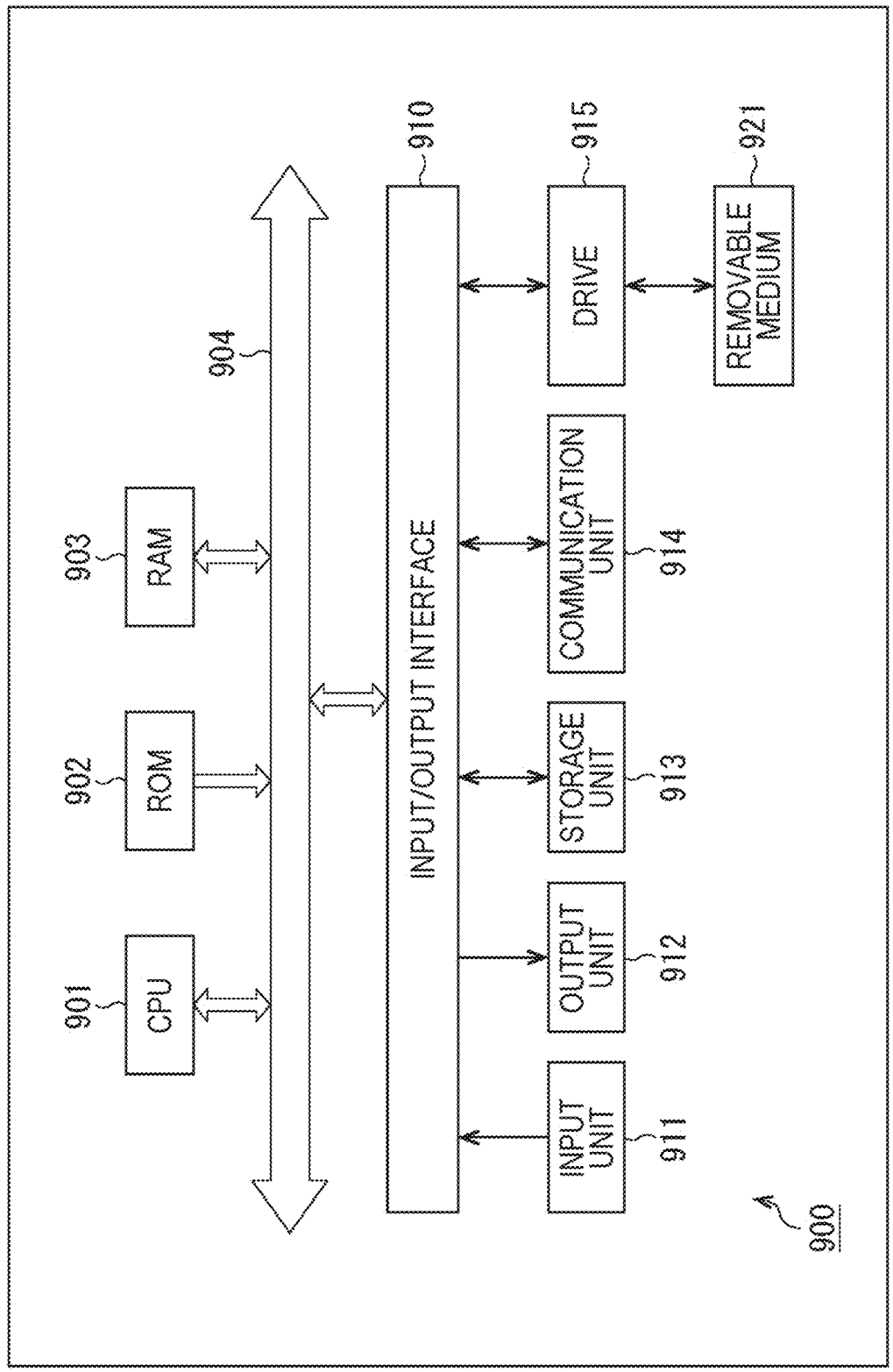
FIG. 28 is a block diagram illustrating a main configuration example of a computer.

FIG. 28 is a block diagram illustrating a configuration example of hardware of a computer that executes the above-described series of processing with a program.

In a computer 900 illustrated in FIG. 28, a central processing unit (CPU) 901, a read only memory (ROM) 902, and a random access memory (RAM) 903 are mutually connected via a bus 904.

Furthermore, an input/output interface 910 is connected to the bus 904. An input unit 911, an output unit 912, a storage unit 913, a communication unit 914, and a drive 915 are connected to the input/output interface 910.

The input unit 911 includes, for example, a keyboard, a mouse, a microphone, a touch panel, an input terminal, or the like. The output unit 912 includes, for example, a display, a speaker, an output terminal, or the like. The storage unit 913 includes, for example, a hard disk, a RAM disk, a non-volatile memory, or the like. The communication unit 914 includes, for example, a network interface. The drive 915 drives a removable medium 921 such as a magnetic disk, an optical disk, a magneto-optical disk, or a semiconductor memory.

In a computer configured as above, the series of processing described above is performed by the CPU 901 loading, for example, a program stored in the storage unit 913 to the RAM 903 via the input/output interface 910 and the bus 904 and executing the program. As appropriate, the RAM 903 also stores data necessary for the CPU 901 to execute various kinds of processing.

A program executed by the computer can be applied by being recorded on the removable medium 921 as a package medium, or the like, for example. In this case, the program can be installed on the storage unit 913 via the input/output interface 910 by attaching the removable medium 921 to the drive 915.

Furthermore, the program can also be provided via a wired or wireless transmission medium such as a local area network, the Internet, or digital satellite broadcasting. In this case, the program can be received by the communication unit 914 and installed on the storage unit 913.

In addition, the program can be installed on the ROM 902 or the storage unit 913 in advance.

<Object to which Present Technology is Applied>

Although the cases where the present technology is applied to encoding and decoding of point cloud data have been described above, the present technology is not limited to these examples, and can be applied to encoding/decoding of 3D data of any standard. For example, in encoding/decoding Mesh data, the Mesh data may be converted into point cloud data, and the encoding/decoding may be performed by applying the present technology. That is, in so far as there is no conflict with the above-described present technology, various types of processing such as an encoding/decoding method, and specifications of various types of data such as 3D data and metadata are arbitrary. Furthermore, in so far as there is no conflict with the present technology, part of the above-described processing or specifications may be omitted.

The present technology can be applied to any configuration. For example, the present technology may be applied to various electronic devices such as a transmitter or receiver (for example, a television receiver or a mobile phone) for satellite broadcasting, wired broadcasting such as cable television, distribution on the Internet, or distribution to a terminal by cellular communication, an apparatus (for example, a hard disk recorder or a camera) that records an image on a medium such as an optical disk, a magnetic disk, or a flash memory, or regenerates an image from the storage medium, or the like.

Furthermore, for example, the present technology can also be implemented as a partial configuration of an apparatus, such as a processor (for example, a video processor) as a system large scale integration (LSI) or the like, a module (for example, a video module) using a plurality of processors or the like, a unit (for example, a video unit) using a plurality of modules or the like, or a set (for example, a video set) obtained by further adding another function to the unit.

Furthermore, for example, the present technology can also be applied to a network system including a plurality of apparatuses. For example, the present technology may be implemented as cloud computing in which the present technology is shared and processed jointly by a plurality of apparatuses via a network. For example, the present technology may be implemented in cloud service that provides a service related to an image (moving image) to an arbitrary terminal such as a computer, an audio visual (AV) apparatus, a portable information processing terminal, or Internet of Things (IoT) device.

Note that, in the present description, the system means a set of a plurality of components (apparatuses, modules (parts), or the like) without regard to whether or not all the components are in the same housing. Therefore, a plurality of apparatuses housed in separate housings and connected via a network, and one apparatus storing a plurality of modules in one housing are both systems.

<Field/Application to which Present Technology is Applicable>

A system, apparatus, processing unit, or the like to which the present technology is applied may be utilized in an arbitrary field such as traffic, medical care, crime prevention, agriculture, stockbreeding, mining, beauty, factory, home appliance, weather, or nature monitoring, for example. Furthermore, application thereof is also arbitrary.

OTHERS

Embodiments of the present technology are not limited to the above-described embodiments, and various changes can be made without departing from the scope of the present technology.

For example, a configuration described as one apparatus (or processing unit) may be divided and configured as a plurality of apparatuses (or processing units). To the contrary, the configurations described above as a plurality of apparatuses (or processing units) may be collectively configured as one apparatus (or processing unit). Furthermore, needless to say, a configuration other than the configurations described above may be added to a configuration of each apparatus (or each processing unit). Moreover, if a configuration and operation of an entire system are substantially the same, a part of a configuration of a certain apparatus (or processing unit) may be included in a configuration of another apparatus (or another processing unit).

Furthermore, for example, the above-described programs may be executed in an arbitrary apparatus. In that case, the apparatus is only required to have a necessary function (function block, or the like) so that necessary information can be acquired.

Furthermore, for example, each step in one flowchart may be executed by one apparatus, or may be executed by being shared by a plurality of apparatuses. Moreover, when a plurality of pieces of processing is included in one step, the plurality of pieces of processing may be executed by one apparatus, or may be executed by being shared by a plurality of apparatuses. In other words, a plurality of pieces of processing included in one step can be executed as processing of a plurality of steps. To the contrary, pieces of processing described as a plurality of steps can be collectively executed as one step.

Furthermore, for example, a program executed by the computer may be a program in which processing of steps describing the program is executed in time series in an order described in the present description, or a program in which the processing may be executed in parallel, or separately at a necessary timing such as when a call is made. That is, unless there is a contradiction, the processing of each step may be executed in an order different from the order described above. Moreover, the processing of steps describing the program may be executed in parallel with processing of another program, or may be executed in combination with processing of another program.

Furthermore, for example, a plurality of techniques related to the present technology can be implemented independently as a single piece unless there is a contradiction. Needless to say, a plurality of arbitrary pieces of the present technology can be used in combination. For example, a part or all of the present technology described in any of the embodiments can be implemented in combination with a part or all of the present technology described in another embodiment. Furthermore, any part or all of the present technology described above can be implemented in combination with another technology not described above.

Note that the present technology can have the following configurations.

(1) An information processing apparatus including
a reference structure formation unit that forms a reference structure of geometry data in coding of a point cloud that represents a three-dimensional object as a set of points,
a correction unit that corrects the geometry data so that a coding amount decreases,
a predictive residual derivation unit that derives, on the basis of the reference structure formed by the reference structure formation unit, a predicted value of the geometry data corrected by the correction unit, and derives a predictive residual that is a difference between the geometry data and the predicted value, and
a coding unit that codes the predictive residual derived by the predictive residual derivation unit.

(2) The information processing apparatus according to (1),
in which the correction unit corrects the geometry data according to the reference structure.

(3) The information processing apparatus according to (1),
in which the correction unit corrects the geometry data so that an error is equal to or less than a predetermined threshold value.

(4) The information processing apparatus according to (1),
in which the correction unit corrects the geometry data by performing resampling that integrates a plurality of the points.

(5) The information processing apparatus according to (4),
in which the correction unit performs the resampling according to the reference structure.

(6) The information processing apparatus according to (5),
in which, in the reference structure, the correction unit performs the resampling on two points, one of which refers to another, to integrate the two points into a midpoint of the two points.

(7) The information processing apparatus according to (6),
in which the correction unit updates a target of the resampling in an order from a parent node to a child node in the reference structure.

(8) The information processing apparatus according to (4),
in which the correction unit performs the resampling so that an error is equal to or less than a predetermined threshold value.

(9) The information processing apparatus according to (4),
in which the correction unit defines attribute data for a point obtained by the integration by the resampling.

(10) The information processing apparatus according to (1),
in which the correction unit corrects the geometry data by performing refinement to move the point.

(11) The information processing apparatus according to (10),
in which the correction unit performs the refinement according to the reference structure.

(12) The information processing apparatus according to (11),
in which the correction unit performs the refinement so as to reduce the predictive residual of a current node in the reference structure.

(13) The information processing apparatus according to (11),
in which the correction unit performs the refinement so as to reduce a sum of the predictive residual of a current node and the predictive residual of a child node of the current node in the reference structure.

(14) The information processing apparatus according to (11),
in which the correction unit updates a target of the refinement in an order from a parent node to a child node in the reference structure.

(15) The information processing apparatus according to (10),
in which the correction unit performs the refinement so that an error is equal to or less than a predetermined threshold value.

(16) The information processing apparatus according to (10),
in which the correction unit performs, on a point on which the refinement is performed, re-color processing of updating attribute data.

(17) The information processing apparatus according to (1),
in which the correction unit corrects the geometry data by performing refinement to move the point, and further performing resampling that integrates a plurality of the points.

(18) The information processing apparatus according to (1),
in which the correction unit corrects the geometry data by performing resampling that integrates a plurality of the points, and performing, on the point after the integration, refinement of moving the point.

(19) The information processing apparatus according to (1), the information processing apparatus further including a quantization unit that quantizes the geometry data,
in which the correction unit corrects the geometry data quantized by the quantization unit.

(20) An information processing method including
forming a reference structure of geometry data in coding of a point cloud that represents a three-dimensional object as a set of points,
correcting the geometry data so that a coding amount decreases,
deriving, on the basis of formed the reference structure, a predicted value of corrected the geometry data, and deriving a predictive residual that is a difference between the geometry data and the predicted value, and
coding derived the predictive residual.

REFERENCE SIGNS LIST

100 Coding apparatus
101 Geometry data coding unit
102 Attribute data coding unit
111 Reference structure formation unit
112 Correction unit
113 Predictive residual derivation unit
114 Coding unit
201 Reference structure holding unit
202 Stack
203 Resampling candidate extraction unit
204 Resampling unit
205 Attribute definition unit
301 Reference structure holding unit
302 Stack
303 Refinement unit 304 Re-color processing unit
400 Coding apparatus
401 Quantization unit
402 Geometry data coding unit
403 Attribute data coding unit
501 Refinement processing unit
502 Resampling processing unit
900 Computer

The invention claimed is:

1. An information processing apparatus, comprising: circuitry configured to
- form a reference structure of first geometry data of a point cloud that represents a three-dimensional object as at least one point;
- derive second geometry data by performing, in an order from a parent node to a child node in the reference structure, at least one of
  - a resampling operation that integrates a plurality of points, or
  - refinement to move the at least one point;
- derive, based on the reference structure, a predicted value of the second geometry data;
- derive a predictive residual that is a difference between the first geometry data and the predicted value; and
- code the predictive residual.

2. The information processing apparatus according to claim 1, wherein
- the at least one point includes a target point and a reference point of the resampling operation, and
- the circuitry is further configured to integrate, in the resampling operation, the target point and the reference point into a midpoint of the target point and the reference point.

3. The information processing apparatus according to claim 1, wherein
- the circuitry is further configured to update a target of the resampling operation in the order from the parent node to the child node in the reference structure.

4. The information processing apparatus according to claim 1, wherein
- the circuitry is further configured to define attribute data for a point obtained by the integration by the resampling operation.

5. The information processing apparatus according to claim 1, wherein
- the circuitry is further configured to update a target of the refinement in the order from the parent node to the child node in the reference structure.

6. The information processing apparatus according to claim 1, wherein
- the circuitry is further configured to perform a re-color processing operation that updates attribute data of the at least one point on which the refinement is performed.

7. The information processing apparatus according to claim 1, wherein
- the second geometry data is derived by performing the resampling operation after the refinement.

8. The information processing apparatus according to claim 1, wherein
- the second geometry data is derived by performing the refinement after the resampling operation.

9. An information processing apparatus, comprising circuitry configured to
- quantize first geometry data of a point cloud that represents a three-dimensional object as at least one point;
- form a reference structure of the quantized first geometry data;
- derive second geometry data by performing, on the quantized first geometry data, at least one of
  - a resampling operation that integrates a plurality of points, or
  - refinement to move the at least one point;
- derive, based on the reference structure, a predicted value of the second geometry data;
- derive a predictive residual that is a difference between the first geometry data and the predicted value; and
- code the predictive residual.

10. An information processing apparatus, comprising: circuitry configured to:
- form a reference structure of first geometry data of a point cloud that represents a three-dimensional object as at least one point;
- derive second geometry data by performing refinement to move the at least one point;
- derive, based on the reference structure, a predicted value of the second geometry data;
- derive a predictive residual that is a difference between the first geometry data and the predicted value; and
- code the predictive residual, wherein the refinement includes at least one of
  - reduction of the predictive residual of a current node in the reference structure, or
  - reduction of a sum of the predictive residual of the current node and the predictive residual of a child node of the current node in the reference structure.

11. An information processing apparatus, comprising: circuitry configured to
- form a reference structure of first geometry data of a point cloud that represents a three-dimensional object as at least one point;
- derive second geometry data by performing refinement to move the at least one point so that an error is equal to or less than a specific threshold value;
- derive, based on the reference structure, a predicted value of the second geometry data;
- derive a predictive residual that is a difference between the first geometry data and the predicted value; and
- code the predictive residual.

12. An information processing method, comprising:
- forming a reference structure of first geometry data of a point cloud that represents a three-dimensional object as at least one point;
- deriving second geometry data by performing, in an order from a parent node to a child node in the reference structure, at least one of
  - resampling that integrates a plurality of points, or
  - refinement to move the at least one point;
- deriving, based on the reference structure, a predicted value of the second geometry data;
- derive a predictive residual that is a difference between the first geometry data and the predicted value; and
- coding the predictive residual.

13. An information processing method, comprising
- quantizing first geometry data of a point cloud that represents a three-dimensional object as at least one point;
- forming a reference structure of the quantized first geometry data;
- deriving second geometry data by performing, on the quantized first geometry data, at least one of
  - resampling that integrates a plurality of points, or
  - refinement to move the at least one point;

deriving, based on the reference structure, a predicted value of the second geometry data;
deriving a predictive residual that is a difference between the first geometry data and the predicted value; and
coding the predictive residual.

14. An information processing method, comprising:
forming a reference structure of first geometry data of a point cloud that represents a three-dimensional object as at least one point;
deriving second geometry data by performing refinement to move the at least one point;
deriving, based on the reference structure, a predicted value of the second geometry data;
deriving a predictive residual that is a difference between the first geometry data and the predicted value; and
coding the predictive residual, wherein the refinement includes at least one of
reducing the predictive residual of a current node in the reference structure, or
reducing a sum of the predictive residual of the current node and the predictive residual of a child node of the current node in the reference structure.

15. An information processing method, comprising:
forming a reference structure of first geometry data of a point cloud that represents a three-dimensional object as at least one point;
deriving second geometry data by performing refinement to move the at least one point so that an error is equal to or less than a specific threshold value;
deriving, based on the reference structure, a predicted value of the second geometry data;
deriving a predictive residual that is a difference between the first geometry data and the predicted value; and
coding the predictive residual.

* * * * *